(12) United States Patent
Chapuis et al.

(10) Patent No.: US 7,710,092 B2
(45) Date of Patent: May 4, 2010

(54) SELF TRACKING ADC FOR DIGITAL POWER SUPPLY CONTROL SYSTEMS

(75) Inventors: Alain Chapuis, Riedikon (CH); Shuyu Lei, Beijing (CN)

(73) Assignee: Power-One, Inc., Camarillo, CA (US)

( * ) Notice: Subject to any disclaimer, the term of this patent is extended or adjusted under 35 U.S.C. 154(b) by 372 days.

(21) Appl. No.: 11/876,756

(22) Filed: Oct. 22, 2007

(65) Prior Publication Data

US 2008/0042632 A1  Feb. 21, 2008

Related U.S. Application Data

(63) Continuation-in-part of application No. 11/349,853, filed on Feb. 7, 2006, now Pat. No. 7,315,157, which is a continuation of application No. 10/779,475, filed on Feb. 12, 2004, now Pat. No. 7,023,190, which is a continuation-in-part of application No. 10/361,667, filed on Feb. 10, 2003, now Pat. No. 6,933,709.

(51) Int. Cl.
    *G05F 1/40* (2006.01)

(52) U.S. Cl. .................. 323/282; 363/65; 341/156

(58) Field of Classification Search ......... 323/282–285, 323/222, 266, 271, 272; 363/17, 21.4, 131; 330/207, 251
    See application file for complete search history.

(56) References Cited

U.S. PATENT DOCUMENTS 3,660,672 A  5/1972  Berger et al.

(Continued)

FOREIGN PATENT DOCUMENTS

CN  2521825  11/2002

(Continued)

OTHER PUBLICATIONS

"Automated Power Distribution System Hardware", Anderson et al.; Aug. 6, 1989; pp. 579-584.

(Continued)

*Primary Examiner*—Rajnikant B Patel
(74) *Attorney, Agent, or Firm*—O'Melveny & Myers LLP

(57) ABSTRACT

A self-tracking analog-to-digital converter includes a digital-to-analog converter (DAC) adapted to provide a variable reference voltage, a windowed flash analog-to-digital converter (ADC) adapted to provide an error signal $e_k$ corresponding to a difference between an input voltage $V_i$ and the variable reference voltage, and digital circuitry adapted to generate suitable control signals for the DAC based on the error signal $e_k$. More particularly, the digital circuitry includes a first digital circuit adapted to provide a first function value $f(e_k)$ in response to the error signal $e_k$, the first function value $f(e_k)$ representing an amount of correction to be applied to the variable reference voltage. A second digital circuit is adapted to provide a counter that combines the first function value $f(e_k)$ with a previous counter state $N_k$ to provide a next counter state $N_{k+1}$, the next counter state $N_{k+1}$ being applied as an input to the digital-to-analog converter. A third digital circuit is adapted to scale the previous counter state $N_k$ by a factor M and combine the scaled counter state $M \cdot N_k$ with the error signal $e_k$ to provide a digital output value $D_k$ representing the input voltage $V_i$.

12 Claims, 10 Drawing Sheets

U.S. PATENT DOCUMENTS

| | | |
|---|---|---|
| 4,194,147 A | 3/1980 | Payne et al. |
| 4,204,249 A | 5/1980 | Dye et al. |
| 4,328,429 A | 5/1982 | Kublick et al. |
| 4,335,445 A | 6/1982 | Nercessian |
| 4,350,943 A | 9/1982 | Pritchard |
| 4,451,773 A | 5/1984 | Papathomas et al. |
| 4,538,073 A | 8/1985 | Freige et al. |
| 4,538,101 A | 8/1985 | Shimpo et al. |
| 4,607,330 A | 8/1986 | McMurray et al. |
| 4,616,142 A | 10/1986 | Upadhyay et al. |
| 4,622,627 A | 11/1986 | Rodriguez et al. |
| 4,630,187 A | 12/1986 | Henze |
| 4,654,769 A | 3/1987 | Middlebrook |
| 4,677,566 A | 6/1987 | Whittaker et al. |
| 4,761,725 A | 8/1988 | Henze |
| 4,940,930 A | 7/1990 | Detweiler |
| 4,988,942 A | 1/1991 | Ekstrand |
| 5,004,972 A | 4/1991 | Roth |
| 5,053,920 A | 10/1991 | Staffiere et al. |
| 5,073,848 A | 12/1991 | Steigerwald et al. |
| 5,079,498 A | 1/1992 | Cleasby et al. |
| 5,117,430 A | 5/1992 | Berglund |
| 5,168,208 A | 12/1992 | Schultz et al. |
| 5,229,699 A | 7/1993 | Chu et al. |
| 5,270,904 A | 12/1993 | Gulczynski |
| 5,272,614 A | 12/1993 | Brunk et al. |
| 5,287,055 A | 2/1994 | Cini et al. |
| 5,349,523 A | 9/1994 | Inou et al. |
| 5,377,090 A | 12/1994 | Steigerwald |
| 5,398,029 A | 3/1995 | Toyama et al. |
| 5,426,425 A | 6/1995 | Conrad et al. |
| 5,440,520 A | 8/1995 | Schutz et al. |
| 5,481,140 A | 1/1996 | Maruyama et al. |
| 5,489,904 A | 2/1996 | Hadidi |
| 5,508,606 A | 4/1996 | Ryczek |
| 5,532,577 A | 7/1996 | Doluca |
| 5,610,826 A | 3/1997 | Whetsel |
| 5,627,460 A | 5/1997 | Bazinet et al. |
| 5,631,550 A | 5/1997 | Castro et al. |
| 5,646,509 A | 7/1997 | Berglund et al. |
| 5,675,480 A | 10/1997 | Stanford |
| 5,684,686 A | 11/1997 | Reddy |
| 5,727,208 A | 3/1998 | Brown |
| 5,752,047 A | 5/1998 | Darty et al. |
| 5,815,018 A | 9/1998 | Soborski |
| 5,847,950 A | 12/1998 | Bhagwat |
| 5,870,296 A | 2/1999 | Schaffer |
| 5,872,984 A | 2/1999 | Berglund et al. |
| 5,874,912 A | 2/1999 | Hasegawn |
| 5,883,797 A | 3/1999 | Amaro et al. |
| 5,889,392 A | 3/1999 | Moore et al. |
| 5,892,933 A | 4/1999 | Voltz |
| 5,905,370 A | 5/1999 | Bryson |
| 5,917,719 A | 6/1999 | Hoffman et al. |
| 5,929,618 A | 7/1999 | Boylan et al. |
| 5,929,620 A | 7/1999 | Dobkin et al. |
| 5,935,252 A | 8/1999 | Berglund et al. |
| 5,943,227 A | 8/1999 | Bryson et al. |
| 5,946,495 A | 8/1999 | Scholhamer et al. |
| 5,990,669 A | 11/1999 | Brown |
| 5,994,885 A | 11/1999 | Wilcox et al. |
| 6,005,377 A | 12/1999 | Chen et al. |
| 6,021,059 A | 2/2000 | Kennedy |
| 6,055,163 A | 4/2000 | Wagner et al. |
| 6,057,607 A | 5/2000 | Rader, III et al. |
| 6,079,026 A | 6/2000 | Berglund et al. |
| 6,100,676 A | 8/2000 | Burstein et al. |
| 6,111,396 A | 8/2000 | Line et al. |
| 6,115,441 A | 9/2000 | Douglass et al. |
| 6,121,760 A | 9/2000 | Marshall et al. |
| 6,136,143 A | 10/2000 | Winter et al. |
| 6,137,280 A | 10/2000 | Ackermann |
| 6,150,803 A | 11/2000 | Varga |
| 6,157,093 A | 12/2000 | Giannopoulos et al. |
| 6,157,182 A | 12/2000 | Tanaka et al. |
| 6,160,697 A | 12/2000 | Edel |
| 6,163,143 A | 12/2000 | Shimamori |
| 6,163,178 A | 12/2000 | Stark et al. |
| 6,170,062 B1 | 1/2001 | Henrie |
| 6,177,787 B1 | 1/2001 | Hobrecht |
| 6,181,029 B1 | 1/2001 | Berglund et al. |
| 6,191,566 B1 | 2/2001 | Petricek et al. |
| 6,194,856 B1 | 2/2001 | Kobayashi et al. |
| 6,194,883 B1 | 2/2001 | Shimamori |
| 6,198,261 B1 | 3/2001 | Schultz et al. |
| 6,199,130 B1 | 3/2001 | Berglund et al. |
| 6,208,127 B1 | 3/2001 | Doluca |
| 6,211,579 B1 | 4/2001 | Blair |
| 6,246,219 B1 | 6/2001 | Lynch et al. |
| 6,249,111 B1 | 6/2001 | Nguyen |
| 6,262,900 B1 | 7/2001 | Suntio |
| 6,288,595 B1 | 9/2001 | Hirakata et al. |
| 6,291,975 B1 | 9/2001 | Snodgrass |
| 6,294,954 B1 | 9/2001 | Melanson |
| 6,304,066 B1 | 10/2001 | Wilcox et al. |
| 6,304,823 B1 | 10/2001 | Smit et al. |
| 6,320,768 B1 | 11/2001 | Pham et al. |
| 6,351,108 B1 | 2/2002 | Burnstein et al. |
| 6,355,990 B1 | 3/2002 | Mitchell |
| 6,366,069 B1 | 4/2002 | Nguyen et al. |
| 6,370,047 B1 | 4/2002 | Mallory |
| 6,373,334 B1 | 4/2002 | Melanson |
| 6,385,024 B1 | 5/2002 | Olson |
| 6,392,577 B1 | 5/2002 | Swanson et al. |
| 6,396,169 B1 | 5/2002 | Voegli et al. |
| 6,396,250 B1 | 5/2002 | Bridge |
| 6,400,127 B1 | 6/2002 | Giannopoulos |
| 6,411,071 B1 | 6/2002 | Schultz |
| 6,411,072 B1 | 6/2002 | Feldman |
| 6,414,864 B1 | 7/2002 | Hoshi |
| 6,421,259 B1 | 7/2002 | Brooks et al. |
| 6,429,630 B2 | 8/2002 | Pohlman et al. |
| 6,448,745 B1 | 9/2002 | Killat |
| 6,448,746 B1 | 9/2002 | Carlson |
| 6,456,044 B1 | 9/2002 | Darmawaskita |
| 6,465,909 B1 | 10/2002 | Soo et al. |
| 6,465,993 B1 | 10/2002 | Clarkin et al. |
| 6,469,478 B1 | 10/2002 | Curtin |
| 6,469,484 B2 | 10/2002 | L'Hermite et al. |
| 6,476,589 B2 | 11/2002 | Umminger et al. |
| 6,556,158 B2 | 4/2003 | Steensgaard-Madsen |
| 6,559,684 B2 | 5/2003 | Goodfellow |
| 6,563,294 B2 | 5/2003 | Duffy et al. |
| 6,583,608 B2 | 6/2003 | Zafarana et al. |
| 6,590,369 B2 | 7/2003 | Burstein et al. |
| 6,608,402 B2 | 8/2003 | Soo et al. |
| 6,614,612 B1 | 9/2003 | Menegoli et al. |
| 6,621,259 B2 | 9/2003 | Jones et al. |
| 6,665,525 B2 | 12/2003 | Dent et al. |
| 6,683,494 B2 | 1/2004 | Stanley |
| 6,686,831 B2 | 2/2004 | Cook |
| 6,693,811 B1 | 2/2004 | Bowman et al. |
| 6,717,389 B1 | 4/2004 | Johnson |
| 6,731,023 B2 | 5/2004 | Rothleitner et al. |
| 6,744,243 B2 | 6/2004 | Daniels et al. |
| 6,771,052 B2 | 8/2004 | Ostojic |
| 6,778,414 B2 | 8/2004 | Chang et al. |
| 6,788,033 B2 | 9/2004 | Vinciarelli |
| 6,788,035 B2 | 9/2004 | Bassett et al. |
| 6,791,298 B2 | 9/2004 | Shenai et al. |
| 6,791,302 B2 | 9/2004 | Tang et al. |
| 6,791,368 B2 | 9/2004 | Tzeng et al. |
| 6,795,009 B2 | 9/2004 | Duffy et al. |
| 6,801,027 B2 | 10/2004 | Hann et al. |

| | | |
|---|---|---|
| 6,807,070 B2 | 10/2004 | Ribarich |
| 6,816,758 B2 | 11/2004 | Maxwell, Jr. et al. |
| 6,819,537 B2 | 11/2004 | Pohlman et al. |
| 6,825,644 B2 | 11/2004 | Kernahan et al. |
| 6,828,765 B1 | 12/2004 | Schultz et al. |
| 6,829,547 B2 | 12/2004 | Law et al. |
| 6,833,691 B2 | 12/2004 | Chapuis |
| 6,850,046 B2 | 2/2005 | Chapuis |
| 6,850,049 B2 | 2/2005 | Kono |
| 6,850,426 B2 | 2/2005 | Kojori et al. |
| 6,853,169 B2 | 2/2005 | Burstein et al. |
| 6,853,174 B1 | 2/2005 | Inn |
| 6,888,339 B1 | 5/2005 | Travaglini et al. |
| 6,903,949 B2 | 6/2005 | Ribarich |
| 6,911,808 B1 | 6/2005 | Shimamori |
| 6,915,440 B2 | 7/2005 | Berglund et al. |
| 6,917,186 B2 | 7/2005 | Klippel et al. |
| 6,928,560 B1 | 8/2005 | Fell, III et al. |
| 6,933,709 B2 | 8/2005 | Chapuis |
| 6,933,711 B2 | 8/2005 | Sutardja et al. |
| 6,936,999 B2 | 8/2005 | Chapuis |
| 6,947,273 B2 | 9/2005 | Bassett et al. |
| 6,949,916 B2 | 9/2005 | Chapuis |
| 6,963,190 B2 | 11/2005 | Asanuma et al. |
| 6,965,220 B2 | 11/2005 | Kernahan et al. |
| 6,965,502 B2 | 11/2005 | Duffy et al. |
| 6,975,494 B2 | 12/2005 | Tang et al. |
| 6,975,785 B2 | 12/2005 | Ghandi |
| 6,977,492 B2 | 12/2005 | Sutardja et al. |
| 7,000,125 B2 | 2/2006 | Chapuis et al. |
| 7,000,315 B2 | 2/2006 | Chua et al. |
| 7,002,265 B2 | 2/2006 | Potega |
| 7,007,176 B2 | 2/2006 | Goodfellow et al. |
| 7,023,192 B2 | 4/2006 | Sutardja et al. |
| 7,023,672 B2 | 4/2006 | Goodfellow et al. |
| 7,047,110 B2 | 5/2006 | Lenz et al. |
| 7,049,798 B2 | 5/2006 | Chapuis et al. |
| 7,068,021 B2 | 6/2006 | Chapuis |
| 7,080,265 B2 | 7/2006 | Thaker et al. |
| 7,141,956 B2 | 11/2006 | Chapuis |
| 7,190,754 B1 | 3/2007 | Chang et al. |
| 7,266,709 B2 | 9/2007 | Chapuis et al. |
| 7,315,157 B2 | 1/2008 | Chapuis |
| 7,315,160 B2 | 1/2008 | Fosler |
| 7,359,643 B2 | 4/2008 | Aronson et al. |
| 7,394,445 B2 | 7/2008 | Chapuis et al. |
| 2001/0052862 A1 | 12/2001 | Roelofs |
| 2002/0070718 A1 | 6/2002 | Rose |
| 2002/0073347 A1 | 6/2002 | Zafarana et al. |
| 2002/0075710 A1 | 6/2002 | Lin |
| 2002/0104031 A1 | 8/2002 | Tomlinson et al. |
| 2002/0105227 A1 | 8/2002 | Nerone et al. |
| 2002/0144163 A1 | 10/2002 | Goodfellow et al. |
| 2003/0006650 A1 | 1/2003 | Tang et al. |
| 2003/0067404 A1 | 4/2003 | Ruha et al. |
| 2003/0122429 A1 | 7/2003 | Zhang |
| 2003/0137912 A1 | 7/2003 | Ogura |
| 2003/0142513 A1 | 7/2003 | Vinciarelli |
| 2003/0201761 A1 | 10/2003 | Harris |
| 2004/0080044 A1 | 4/2004 | Moriyama et al. |
| 2004/0093533 A1 | 5/2004 | Chapuis et al. |
| 2004/0123164 A1 | 6/2004 | Chapuis et al. |
| 2004/0123167 A1 | 6/2004 | Chapuis |
| 2004/0174147 A1 | 9/2004 | Vinciarelli |
| 2004/0178780 A1 | 9/2004 | Chapuis |
| 2004/0189271 A1 | 9/2004 | Hanson et al. |
| 2004/0201279 A1 | 10/2004 | Templeton |
| 2004/0225811 A1 | 11/2004 | Fosler |
| 2004/0246754 A1 | 12/2004 | Chapuis |
| 2005/0093594 A1 | 5/2005 | Kim et al. |
| 2005/0117376 A1 | 6/2005 | Wilson |
| 2005/0146312 A1 | 7/2005 | Kenny et al. |
| 2005/0200344 A1 | 9/2005 | Chapuis |
| 2005/0289373 A1 | 12/2005 | Chapuis et al. |
| 2006/0022656 A1 | 2/2006 | Leung et al. |
| 2006/0085656 A1 | 4/2006 | Betts-LaCroix |
| 2006/0149396 A1 | 7/2006 | Templeton |
| 2006/0174145 A1 | 8/2006 | Chapuis et al. |
| 2006/0244570 A1 | 11/2006 | Leung et al. |
| 2006/0250120 A1 | 11/2006 | King |
| 2007/0114985 A1 | 5/2007 | Latham et al. |
| 2008/0074373 A1 | 3/2008 | Chapuis et al. |
| 2008/0238208 A1 | 10/2008 | Potter et al. |

FOREIGN PATENT DOCUMENTS

| | | |
|---|---|---|
| EP | 0255258 | 2/1988 |
| EP | 0315366 | 5/1989 |
| EP | 0401562 | 12/1990 |
| EP | 0660487 | 6/1995 |
| EP | 0875994 | 11/1998 |
| EP | 0877468 | 11/1998 |
| EP | 0997825 | 5/2000 |
| GB | 2377094 | 12/2002 |
| JP | 60-244111 | 12/1985 |
| JP | 1185329 | 3/1999 |
| JP | 11-289754 | 10/1999 |
| KR | 200284495 | 8/2002 |
| RU | 1359874 | 12/1985 |
| RU | 1814177 | 5/1993 |
| WO | WO93/19415 | 9/1993 |
| WO | WO01/22585 | 3/2001 |
| WO | WO02/31943 | 4/2002 |
| WO | WO02/31951 | 4/2002 |
| WO | WO02/50690 | 6/2002 |
| WO | WO02/063688 | 8/2002 |
| WO | WO 03/030369 | 4/2003 |

OTHER PUBLICATIONS

"MicroSCADA Technology Rev. 8.4.2 Documentation CD: Application Objects, Chapter 5. Data Objects", CD-ROM; Sep. 18, 1998, ABB, XP002481365; 11 Pages.

"Modern User Interface Revolutionizes Supervisory Systems", D'Armour et al.; IEEE Computer Applications in Power; vol. 7, No. 1; Jan. 1, 1994; pp. 34-39.

"Open Architecture Distributed Processing—The Modern Design for Electric Power Network Automation", Hissey et al.; IEEE Region 9 Colloquium; Sep. 1990; pp. 150-161; XP010038436.

Microturbine Power Conversion Technology Review, Staunton et al.; Oak Ridge National Laboratory Technical Report; Apr. 8, 2003; 40 pages.

Microcomputer Control of DC/DC Converters for Photovoltaic Applications, Peracaula et al.; Dept. of Electronics Engineering, Industrial Electronics Group—Technical University of Catalonia, Spain; 1991; 4 pgs.

I2C-Bus Specification, The, Version 2.1, Jan. 1, 2000; Document Order No. 9398 393 40011, pp. 1-46.

25 Watt DC-DC Converters, Melcher The Power Partners and Power-One Group of Companies, Industrial Environment, Apr. 4, 1999, DC-DC Converters <40 Watt, G Series, 16 Pages.

-48V Programmable Hot Swap Sequencing Power Controller, Summit Microelectronics, Inc., Oct. 30, 2002, SMH4804, 41 Pages.

33702 Microprocessor Power Supply (3.0A), Analog Products MC33702 Fact Sheet; Motorola/Digital dna/Power Management Switchings; Jan. 1, 2003, pp. 1-4.

Accelerator-Control-System Interface for Intelligent Power Supplies, S. Cohen, Los Alamos National Laboratory, Jan. 1, 1992, pp. 183-186.

Advanced Configuration and Power Interface Specification, Intel Corporation, Microsoft Corporation, Toshiba Corp, Feb. 2, 1999, Revision 1.0b, 387 Pages.

Advantages of Microcontrollers in DC-DC Converters, Galaxy Power, Jan. 1, 2003 IBM Symposium, Real Solutions for Distributed Power, 8 Pages.

Agilent E364xA Single Output DC Power Supplies, User's Guide; Agilent Technologies, Part No. E3640-90001, Jan. 1, 2000, 207 pages.

Agilent E3640A—E3649A Programmable dc Power Supplies, Data Sheet; Agilent Technologies, Jan. 1, 2000, 4 pages.

Architecture and IC implementation of a digital VRM controller, Jinwen, Xiao et al, 32nd Annual IEEE Power Electronics Specialists Conference. PESC 2001. Conference Proceedings. Vancouver, Canada, Jun. 17-21, 2001, Annual Power Electronics Specialists Conference, New York, NY : IEEE, US, vol. vol. 1 of 4. Conf. 32, Jun. 17, 2001, pp. 38-47, XP010559121 ISBN: 0-7803-7067-8, figure 7.

Automating the Design of a Generic Modular Power System for the Global Market, Pedersen, George, Briggs, Steve; Massey, Paul, Advance Power Raynham Road, Bishops Stortford, Herts.; Jan. 1, 1999, CM23 5PF UK.

Auto Sequence Programming Examples for GPIB-M, Xantrex Technology, Inc., Nov. 27, 2002, 1.0a, 4 pages.

BE510 / BE510S Modules—Bipolar DC Source from 100mV to 20V and from 100nA to 4A, Innovative Test Systems; BE510 Version II, Issue 9, Nov. 12, 2000, 3 Pages.

BE52x Modules—Multi-range bipolar DC sources from 30V to 500V, 90W, Innovative Test Systems; BE52x Version A, Issue 9, Aug. 3, 2001, 3 pages.

Characteristics of Automated Power System Monitoring & Management Platforms, Hawkins, John M.; Telepower Australia Pty Ltd, Jan. 1, 2000, telepower@telepower.com.au, IEEE, Intelec, 5 Pages.

Chemistry-Independent Battery Chargers, Maxim Integrated Products, Dec. 1, 2002, 19-1158, Rev 1, MAX1647/MAX1648, 25 Pages.

Continuing Evolution of Intelligence for Telecommunications Power Plants, The, Godby, Jimmy, Apr. 1, 1996, IEEE, 0-7803-3507-4/96, pp. 70-75.

Controlling and Alarming DC Power Plants via the Internet, Cosentino, Anthony P.; Sullivan, Michael C.; Baxter, Richard V. Jr.; Loeck, JonPower Conversion Products, LLC and Pensar Corporation, Jan. 1, 1998, 6 pages.

Current-Fed Multiple-Output Power Conversion, Seamus O'Driscoll; John G. Hayes and Michael G. Egan; Artesyn Technologies; Dept. of Electrical Engineering, University College Cork, Ireland, Dec. 3, 2003, 7 pages.

DALI Manual, DALI AG, Digital Addressable Lighting Interface Activity Group, ZVEI-Division Luminaires, Jan. 1, 2001, pp. 1-62.

Defendant's Artesyn Technologies, Inc.'s Preliminary Invalidity Contentions—(Power-One, Inc. vs. Artesyn Technologies, Inc. et al.), Civil Action No. 2-05-CV-463 (LED), United States District Court for the Eastern District of Texas; Apr. 26, 2006.

DHP Series DC Power Supplies, IEEE 488.2/RS-232 Options Programming Manual; Sorensen, Division of Elgar Electronics Corporation, Document No. M550005-01 Rev B, Jul. 29, 2002, 32 pages.

Digital Addressable Lighting Interface (DALI): An Emerging Energy-Conserving Lighting Solution, The, Ronat, Odile; International Rectifier, Apr. 9, 2002, TP4/9/2002, pp. 1-6.

Digital Multiphase Power from Primarion and Intersil Changing the Landscape of Processor Power, Primarion, Inc., White Paper, Sep. 12, 2002, 6 pages.

Digitally Controlled Power Systems: How Much Intelligence is Needed and Where it Should be, Lock, Tom; RELTEC Corporation, Jan. 1, 1998, IEEE, 4 pages.

Digitally-Controlled SMPS Extends Power System Capabilities, Vinsant, Ron; DiFiore, John; Clarke, Richard, PCIM, Jun. 1, 1994, pp. 30-37.

Digitally Controlled Zero-Voltage-Switched Fullbridge Converter, A, Rinne, Karl-Heinz; Theml, Klaus; Duigan, Joseph; McCarthy, Oliver, Power Conversion, Jun. 1, 1994 Proceedings, pp. 317-324.

Distributed Intelligence and Modular Architecture for Next Generation DC Power System, Duguay, Louis; Got, Pierre, Astec Advanced Power Systems, Quebec, Canada; Jan. 1, 2000, 6 pgs.

Distributed Power Hot Swap Controller, Summit Microelectronics, Inc., Mar. 19, 2001, SMH4804; 2050 2.3, 32 pages.

Dual 550kHz Synchronous 2-Phase Switching Regulator Controller, Linear Technology, Jan. 1, 1998, LTC1702, 36 Pages.

Dual Smart Card Interface TDA802OHL, Philips Semiconductors, Integrated Circuits, Data Sheet, Feb. 24, 2001, I2C Bus, TDA802OHL, Objective Specification v4.2 Supersedes data of Jan. 2001 File under Integrated Circuits, iCXX, 22 Pages.

Dual Smart Card Interface TDA802OHL/C2, Christophe Chausset, Philips Semiconductors, May 20, 2003, Application Note, TDA8020HL/C2, AN10232, 28 Pages.

Electronic Products Power Supply Special: Programmable Supplies Use Switch-Mode Topologies, Birman, Paul; Nercessian, Sarkis; Kepco, Inc. Flushing NY; vol. 37, No. 10, Electronic Products, Mar. 1, 1995; The Engineer's Magazine of Product Technology; Power Supply Special; DSO Samples Single Shots at 10 Gsamples/s Speech Recognition On A Single Chip LCD Has Flat-Panel Benefits At CRT Cost Product Update: High-Performance OP AMPS; A Hearst Business Publication; pp. 1, 5, 33-34.

Fieldbus System Engineering Guidelines, Fieldbus Foundation, 2003-2004, pp. 1-94.

High Efficiency, 2-Phase Synchronous Step-Down Switching Regulators, Linear Technology, Jan. 1, 1998, LTC1628/LTC1628-PG, 32 Pages.

High Efficiency Synchronous Step-Down Switching Regulator, Linear Technology, Jan. 1, 1998, LTC1735, 33 Pages.

High-frequency digital controller IC for DC/DC converters, Patella B J et al; APEC 2002. 17th. Annual IEEE Applied Power Electronics Conference and Exposition. Dallas, TX, Mar. 10-14, 2002, Annual Applied Power Electronics Conference, New York, NY : IEEE, US, vol. vol. 2 of 2. Conf. 17, Mar. 10, 2002, pp. 374-380, XP010582947, ISBN: 0-7803-7404-5, p. 375, right-hand column; figure 3.

Highly Programmable Voltage Supply Controller and Supervisory Circuit, Summit Microelectronics, Inc., Jun. 7, 2001, SMS44, Preliminary, 19 Pages.

IEEE Standard Codes, Formats, Protocols, and Common Commands for User with IEEE Std 488.1-1987, IEEE Standard Digital Interface for Programmable Instrumentation, IEEE Std 488.2-1992; IEEE, Jun. 18, 1992, ISBN 1-55937-238-9, 254 pages.

IMPI Intelligent Platform Management Bus Communications Protocol Specification v1.0, Intel, Hewlett-Packard, NEC, Dell, Document Revision 1.0, Nov. 15, 1999, 39 pages.

Implementing a Nationwide Energy Management System, Sjöberg, Stig; Hedberg, Tommy; Selberg, Lars; Wikström, Rober, Jan. 1, 2000.

Infinite Impulse Response, Wikipedia, http://en.wikipedia.org/wiki/IIR, May 2, 2006, pp. 1-4.

In-Situ Transfer Function Analysis, 2006 Digital Power Forum Presentaiton; Mark Hagen, Texas Instruments Digital Power Group, Jul. 1, 2006.

Installation Guide MPS Mainframe Model 66000A, Agilent Technologies, Agilent Part No. 66000-90001, 1991-Apr. 2000, 26 pages.

In-System Network Analyzer, 2006 Digital Power Forum Prensentaiton, Silicon Laboratories, Jul. 7, 2006.

Integrate Internet Solutions Into Your Energy Management Network, Sarkinen, Johan; Lundin, Ola; Jun. 1, 1998, 7 pages.

Integrity-One: Installation, Operation and Maintenance Manual, Power-One, Inc., 1999-2003 Version 1.2 (P025374-P025559).

Integrity-One Power System—Rack System, Data Sheet, Power-One, Inc., Nov. 1, 2002, (P025580-P025583).

Intelligent, Fault Tolerant, High Power, Distributed Power System for Massively Parallel Processing Computers, An, Burns, J.; Riel, J.; DiBene, T., IEEE, May 1, 1994, 0-7803-1456-5/94, pp. 795-798.

Intelligent Platform Management Interface Specification v1.5, Intel, Hewlett-Packard, NEC, Dell, Document Revision 1.1, Feb. 20, 2002, 459 pages.

Intelligent Power Supply Controller, Rumrill, R.S.; Reinagel, D.J.; IEEE, Aug. 1, 1991, 0-7803-0135-8/91, PAC 1991, pp. 1537-1539.

KEKB Power Supply Interface Controller Module, Akiyama, Nakamura, Yoshida, Kubo, Yamamoto, Katoh; High Energy Accelerator Research Organization, 1-1 Ohio, Tsukuba 305, Japan; International Conference on Accelerator and Large Experimental Physics and Control Systems, Jan. 1, 1997, Beijing, China 4 pgs.

Low Voltage Study Workshop Report, Charles E. Mullett; Lou Pechi; PSMA, Power Sources Manufacturers Association, The Multinational Power Electronics Association, Jan. 1, 2001, 150 Pages.

Magnet Power Supply Control System in KEKB Accelerators, Akiyama, Katoh, Kubo, Yamamoto, Yoshida; KEK, Tsukuba, Japan;

International Conference on Accelerator and Large Experimental Physics and Control Systems, Jan. 1, 1999, Triest, Italy pp. 406-408.
Magnet Power Supply as a Network Object, Cohen, S.; Stuewe, R.; IEEE, Aug. 1, 1991, 0-7803-0135-8/91, PAC 1991, pp. 929-931.
Market Trends Toward Enhanced Control of Electronic Power Systems, Miles, F.M.; Danak, R.K.; Wilson, T.G.; Suranyi, G.G.; IEEE, Jan. 1, 1993, 0-7803-0982-0/93, pp. 92-98.
Memorandum Opinion and Order, Power One v Artesyn Technologies, Inc.; Civil Action 2:05cv463, Mar. 22, 2007.
Microchip AN811, The RS-232/DALI Bridge Interface, Microchip Technology Inc., Jan. 1, 2002, DS00811A, pp. 1-8.
Microchip AN809, Digitally Addressable DALI Dimming Ballast, Microchip Technology Inc., Jan. 1, 2002, DS00809B, pp. 1-18.
Microchip AN703, Using the MCP320X 12-Bit Serial A/D Converter with Microchip PICmicro® Devices, Microchip Technology Inc., Jan. 1, 2002, DS00703A, pp. 1-25.
Microchip PIC16C781/782 Data Sheet, 8-bit CMOS Microcontrollers with A/D, D/A, OPAMP, Comparators and PSMC, Microchip Technology Inc., Jan. 1, 2001, pp. 1-184.
Microprocessor Core Supply Voltage Set by 1 2 C Bus Without VID Lines—Design Note 279, Mark Gurries; Linear Technology—Design Notes, Jan. 7, 2002, 2 Pages.
Motorola Switch Mode Power Supply with Multiple Linear Regulators and High Speed CAN Transceiver, Motorola, Inc. 2002; digital dna; Analog Marketing; Rev. 2.5, Nov. 1, 2002; 33394; Multi-Output Power Supply Semiconductor Technical Data.
NEBS Compliant Board Level Power System, Thomas J. DeLurio, Mikhail Guz and John Ng; Summit Microelectronics, Power One, Oct. 20, 2002, 7 Pages.
New Applications Demand Programmable Power Supplies/Sources, O'Shea, Paul; http://www.evaluationengineering.com/archive/articles/0997powr.htm, Nelson Publishing, Inc., Jan. 1, 1997, 8 pages.
New Digital Power Delivery Architecture, Bob Carroll, Primarion, Sep. 1, 2004, 5 Pages.
Non-Impact Printer Power and Motor Control System on a Chip, Masson, James; Barrow, Steven; IEEE, Apr. 1, 1995, IEEE Catalogue No. 95TH8025, 0-7803-2423-4/95, pp. 98-103.
Operating and Service Manual MQ Series DC Power Supplies, Magna-Power Electronics, Inc., Dec. 19, 2002, 48 pages.
Operating and Service Manual SBC488A, Magna-Power Electronics, Inc., Dec. 19, 2002, 58 pgs.
Operating and Service Manual SQ Series, DC Power Supplies, Magna-Power Electronics, Inc., Dec. 16, 2002, 48 pgs.
Operating Manual for Internal RS-232 Interface for XT 60 Watt and HPD 300 Watt Series Programmable DC Power Supplies, Xantrex Technology, Inc., Jun. 1, 2002, 59 pages.
Operation and Maintenance Process Model for Energy Management, An, Lundin, Ola; Ericsson Components AB, Energy Systems Division, Jan. 1, 1999, S-164 81 KISTA—Stockholm, Sweden; 7 pages.
Optimizing Power Product Usage to Speed Design Validation Testing, Application Note 1434; Agilent Technologies, Nov. 22, 2002, 16 pages.
PCS Controller, Data Sheet, Power-One, Inc. Nov. 1, 2002 (P025584-P025585).
PCX-150A 150 Amp Pulsed Current Source Operation Manual, Version 3.0, Directed Energy, Inc., Jan. 1, 2001, Document No. 9100-0212 R4, 31 pages.
PMP 25 Rectifier Module, Data Sheet, Power-One, Inc., Undated, (P025602-P025603).
Power Distribution Systems for Future Homes, Lee, Po-Wa; Lee, Yim-Shu; Lin, Bo-Tao; IEEE, Aug. 1, 1999, 0-7803-5769-88/99, pp. 1140-1146.
Power LAN for Telecommunication Power Supply Equipment, A, Vun C.H., Nicholas; C.T., Lau; B.S., Lee; IEEE TENCON '93 Beijing, Jan. 1, 1993, pp. 24-27.
Power Management Solutions for Networking Applications, Darmon, Luc; Smart Networks Developer Forum 2003, Jun. 4-6, 2003, Euro-Disney Paris, France, Motorola digital dna; pp. 1-26; www.motorola.com/sndf.
Power System Controller in an Intelligent Telecom Rectifier Plant, Roth, Ueli; IEEE, Aug. 1, 1992, 0-7803-0779-8/92, pp. 476-483.
Preliminary Information 1.5A Switch-Mode Power Supply with Linear Regulator, 33701; Power Supply Integrated Circuit; Motorola Seminconductor Technical Data; Analog Marketing MC33701/D Rev. 1.0, May 1, 2003; Motorola digial dna; pp. 1-24.
Presenting DALI, AG DALI, Jul. 1, 2003, pp. 1-17.
Programmable Four-Channel Step-Down DC/DC Converter, Texas Instruments, Oct. 1, 2001, TPS54900, 16 Pages.
Programming Guide Series 661xxA MPS Power Modules, Agilent Technologies, Agilent Part No. 5959-3362, 1991-2000, 114 pages.
Programmer Manual, PS2520G & PS2521G Programmable Power Supplies, Tektronix, 070-9197-00, Jan. 1, 1995, 70 pages.
Power Management for Communications: Product Information, Summit Microelectronics, Inc., Jan. 23, 2001, 168 Pages, http://www.summitmicro.com.
Power Management for Communications: Corporate Overview, Summit Microelectronics Inc., Oct. 1, 2002, 213 Pages.
Power Semiconductors and Power Supplies—The Building Blocks of the Digital Power Revolution, Todd Cooper and Holman Harvey; Stephens, Inc. Investment Bankers, Sep. 1, 2000, 132 Pages.
Quad Tracking Power Supply Manager, Summit Microelectronics, Inc., Mar. 4, 2002, SMT4004, 35 Pages.
Quantization Resolution and Limit Cycling in Digitally Controlled PWM Converters, Peterchev, Angel V.; Sanders, A.V.; Electrical Engineering and Computer Science; UC Berkley; Power Electronics Specialists Conference, 2001.PESC, vol. 2, Jun. 17-21, 2001; pp. 465-471; XP002274573.
R Option, S Option DC Power Supplies, IEEE 488.2/RS-232 Programming Manual; Power Ten, Document No. M550013-01 Rev C, Jun. 25, 2002, 56 pages.
SCPI Programming Examples for GPIB-M, Xantrex Technology, Inc., Nov. 26, 2002, 1.0, 3 pages.
Service Guide for Agilent 6610xA Power Modules, Agilent Technologies, Agilent Part No. 5959-3364, Dec. 1, 2002, 101 pages.
Silicon Labs Preliminary Invalidity Contentions, Civil Action No. 2-05-CV-463 (LED)—May 26, 2006 (U.S. District Court Eastern District of Texas).
Simple digital hardware to control a PFC converter, A, Zumel P et al; IECON'01. Proceedings of the 27th. Annual Conference of the IEEE Industrial Electronics Society. Denver, CO, Nov. 29-Dec. 2, 2001, Annual Conference of the IEEE Industrial Electronics Society, New York, NY : IEEE, US, v01. vol. 1 of 3. Conf. 27, Nov. 29, 2001, pp. 943-948, XP010572905 ISBN: 0-7803-7108-9, paragraph [IIIC].
Single-Inductor Multiple-Output Switching Converters, Wing-Hung Ki and Dongsheng Ma; Integrated Power Electronics Laboratory, Department of Electrical and Electronic Engineering, The Hong Kong University of Science and Technology, Clear Water Bay, Hong Kong SAR, China, Jan. 1, 2001, 6 Pages.
Six-Channel Power Supply Supervisor and Cacsade Sequence Controller, Summit Microelectronics, Inc., Jul. 16, 2003, SMS66, Preliminary Information, 26 Pages.
SMBus Controls CPU Voltage Regulators without VID Pins, Mark Gurries, Design Ideas, Linear Technology Magazine, Sep. 1, 2001, 2 Pages.
SMBus VID Voltage Programmers, Linear Technology, Jan. 1, 2001, LTC1699 Series, 20 Pages.
SMH4804, SMP9210 and SMT4004 Telecom Reference Design, Summit Microelectronics, Inc., Sep. 5, 2002, Application Note 25, 17 Pages.
Synchronization of Multiple Voltage Regulator Outputs, Mueller, M.W.; et al., IBM Technical Disclosure Bulletin, Jun. 1, 1999; 2 pages.
System Management Bus (SMBus) Specification Version 2., Duracell, Inc., Energizer Power Systems, Inc., Fujitsu, Ltd., Intel Corporation, Linear Technology, Inc., Maxim Integrated Products, Mitsubishi Electric Semiconductor Company, PowerSmart, Inc., Toshiba Battery Co. Ltd., Unitrode Corporation, USAR Systems, Inc., Aug. 3, 2000, pp. 1-59.
System Management Bus Specification, Revision 1.1, Smart Battery System Specifications, Revision 1.1, Dec. 11, 1998; Copyright 1996, 1997, 1998, Benchmarq Microelectronics Inc., Duracell Inc., Energizer Power Systems, Intel Corporation, Linear Technology Corporation, Maxim Integrated Products, Mitsubishi Electric Corporation, National Semiconductor Corporation, Toshiba Battery Co., Varta Batterie AG. 39 pgs.

Technical Overview, FOUNDATION™ fieldbus, Freedom to Choose. Power to Integrate, Fieldbus Foundation, Jan. 1, 2003, FD-043 Rev 3.0, pp. 1-37.

Testing Intelligent Power Supplies for the Los Alamos National Laboratory Accelerator Complex, Sturrock, J.C. ; Cohen, S.; Weintraub, B.L.; Hayden, D.J.; Archuletta, S.F. ; Los Alamos National Laboratory, Jan. 1, 1992, pp. 217-219.

Uniform Language for Accessing Power Plants—Human-Machine Language, ANSI T1.317-1993; American National Standards Institute, Dec. 14, 1993, 55 pages.

User's Guide Series 661xxA MPS Power Modules & Model 66001A MPS Keyboard, Agilent Technologies, Agilent Part No. 5959-3386, 1992-Apr. 2000, 53 pages.

User Manual, PS2520, P52520G, PS2521 & PS2521G Programmable Power Supplies, Tektronix, 070-9196-00, Jan. 1, 1995, 56 pages.

Volume 1: Syntax and Style, SCPI Consortium, May 1, 1999, Version 1999.0, 67 pages.

Volume 1: Syntax and Style, Standard Commands for Programmable Instruments (SCPI) Consortium, May 1, 1997, Version 1997.0, 68 pages.

Volume 2: Command Reference, SCPI Consortium, May 1, 1999, Version 1999.0, 565 pages.

Volume 2: Command Reference, SCPI Consortium, May 1, 1997, Version 1997.0, 506 pages.

Volume 3: Data Interchange Format, SCPI Consortium, May 1, 1999, Version 1999.0, 72 pages.

Volume 3: Data Interchange Format, SCPI Consortium, May 1, 1997, Version 1997.0, 73 pages.

Volume 4: Instrument Classes, SCPI Consortium, May 1, 1999, Version 1999.0, 115 pages.

Volume 4: Instrument Classes, SCPI Consortium, May 1, 1997, Version 1997.0, 58 pages.

VXI Bus Programmable DC Power Supplies, Advanced Power Designs, Inc., Irvine, CA; Jan. 1, 1993, 5 pages.

Why have Monitoring?, Shawyer, P.; Hobbs. P.; McLeod, A.; Jan. 1, 2001, 8 Pages.

Wide Operating Range, No Sense Step-Down Controller, Linear Technology, Jan. 1, 2001, LTC1778/LTC1778-1, 24 Pages.

Wide Operating Range, No Sense Step-Down DC-DC Controller with SMBus Programming, Linear Technology, Jan. 1, 2001, LTC1909-8, 34 Pages.

SELF TRACKING ADC FOR DIGITAL POWER SUPPLY CONTROL SYSTEMS

RELATED APPLICATION DATA

This application is a continuation-in-part of application Ser. No. 11/349,853, filed Feb. 7, 2006 now U.S. Pat. No. 7,315,157, for ADC TRANSFER FUNCTION PROVIDING IMPROVED DYNAMIC REGULATION IN A SWITCHED MODE POWER SUPPLY, which was a continuation of application Ser. No. 10/779,475, filed Feb. 12, 2004, now issued as U.S. Pat. No. 7,023,190 on Apr. 4, 2006, which was in turn a continuation-in-part of application Ser. No. 10/361,667, filed Feb. 10, 2003 now U.S. Pat. No. 6,933,709, for DIGITAL CONTROL SYSTEM AND METHOD FOR SWITCHED MODE POWER SUPPLY.

BACKGROUND OF THE INVENTION

1. Field of the Invention

The present invention relates to power supply circuits, and more particularly to digital control systems and methods for switched mode power supply circuits.

2. Description of Related Art

Switched mode power supplies are known in the art to convert an available direct current (DC) or alternating current (AC) level voltage to another DC level voltage. A buck converter is one particular type of switched mode power supply that provides a regulated DC output voltage to a load by selectively storing energy in an output inductor coupled to the load by switching the flow of current into the output inductor. It includes two power switches that are typically provided by MOSFET transistors. A filter capacitor coupled in parallel with the load reduces ripple of the output current. A pulse width modulation (PWM) control circuit is used to control the gating of the power switches in an alternating manner to control the flow of current in the output inductor. The PWM control circuit uses signals communicated via a feedback loop reflecting the output voltage and/or current level to adjust the duty cycle applied to the power switches in response to changing load conditions.

Conventional PWM control circuits are constructed using analog circuit components, such as operational amplifiers, comparators and passive components like resistors and capacitors for loop compensation, and some digital circuit components like logic gates and flip-flops. But, it is desirable to use entirely digital circuitry instead of the analog circuit components since digital circuitry takes up less physical space, draws less power, and allows the implementation of programmability features or adaptive control techniques. A conventional digital control circuit includes an analog-to-digital converter (ADC) that converts an error signal representing the difference between a signal to be controlled (e.g., output voltage ($V_o$)) and a reference into a digital signal having n bits. The digital control circuit uses the digital error signal to control a digital pulse width modulator, which provides control signals to the power switches having a duty cycle such that the output value of the power supply tracks the reference. In order to keep the complexity of the PWM control circuit low, it is desirable to hold the number of bits of the digital signal to a small number. At the same time, however, the number of bits of the digital signal needs to be sufficiently high to provide resolution good enough to secure precise control of the output value. Moreover, the ADC needs to be very fast to respond to changing load conditions. Current microprocessors exhibit supply current slew rates of up to 20 A/µs, and future microprocessors are expected to reach slew rates greater than 350 A/µs, thereby demanding extremely fast response by the power supply.

Single stage (i.e., flash) ADC topologies are utilized in power supply control circuit applications since they have very low latency (i.e., overall delay between input and output for a particular sample). If a standard flash ADC device is used to quantize the full range of regulator output voltage with desired resolution (e.g., 5 mV), the device will necessarily require a large number of comparators that will dissipate an undesirable amount of power. Under normal operation, the output voltage $V_o$ of the regulator remains within a small window, which means that the ADC need not have a high resolution over the entire range. Accordingly, a "windowed" ADC topology permits high resolution over a relatively small voltage range tracked by a reference voltage ($V_{ref}$). Since the quantization window tracks the reference voltage $V_{ref}$, the signal produced by the ADC will be the voltage error signal. Thus, the windowed ADC provides the dual functions of the ADC and error amplifier, resulting in a further reduction of components and associated power dissipation.

Notwithstanding these advantages, a drawback with the windowed ADC topology is that the device can go into saturation due to transient load conditions that cause the window ranges to be exceeded. By way of example, a 4-bit windowed ADC has a least significant bit (LSB) resolution of roughly 5 mV. This means that an output voltage error of as low as ±40 mV pushes the ADC into saturation. The ADC would then continue to reflect the same error signal (i.e., maximum) even though the actual error could grow even larger, referred to as a "windup" condition of the digital control system. The reaction of the feedback loop in this windup condition can be difficult to predict, since without accurate information about the error size the digital control system no longer functions as a linear system. This behavior can be particularly harmful, since it can damage the load due to overcurrent and/or overvoltage, and can also damage the power supply itself.

Another disadvantage of the ADC is that it digitizes only the loop error. There is therefore no digital representation of the absolute output voltage ($V_o$). In order to monitor the power supply and the feedback loop it is very often necessary to add other supervisory circuits to provide functions such as under-voltage protection, Power-Good-Low monitor, Power-Good-High monitor, and over-voltage protection. Since the voltage thresholds monitored by those supervisory circuits are usually not within the range of the ADC circuit, additional analog comparators together with analog voltage thresholds would be necessary. This is not economical and is very often not very accurate.

It would therefore be advantageous to have an ADC circuit that provides a digital representation of a parameter that needs to be regulated (e.g., the absolute output voltage of a power supply), so that any additional monitoring and supervisory circuits could be implemented as full digital circuits. Furthermore, it would be advantageous to provide an ADC circuit having high resolution around the steady state operating point of the power supply, but that can also settle quickly to a new operating point.

SUMMARY OF THE INVENTION

The present invention provides a self-tracking analog-to-digital converter (ADC) for use in applications such as in a switched mode power supply. The self-tracking ADC overcomes the disadvantages of the prior art by providing a digital representation of a parameter under regulation (e.g., the absolute output voltage of a power supply), thereby enabling any additional monitoring and supervisory circuits to be implemented as full digital circuits.

In an embodiment of the invention, a self-tracking analog-to-digital converter includes a digital-to-analog converter (DAC) adapted to provide a variable reference voltage, a windowed flash analog-to-digital converter (ADC) adapted to provide an error signal $e_k$ corresponding to a difference between an input voltage $V_i$ and the variable reference voltage, and digital circuitry adapted to generate suitable control signals for the DAC based on the error signal $e_k$. More particularly, the digital circuitry includes a first digital circuit adapted to provide a first function value $f(e_k)$ in response to the error signal $e_k$, the first function value $f(e_k)$ representing an amount of correction to be applied to the variable reference voltage. A second digital circuit is adapted to provide a counter that combines the first function value $f(e_k)$ with a previous counter state $N_k$ to provide a next counter state $N_{k+1}$, the next counter state $N_{k+1}$ being applied as an input to the digital-to-analog converter. A third digital circuit is adapted to scale the previous counter state $N_k$ by a factor M and combine the scaled counter state $M \cdot N_k$ with the error signal $e_k$ to provide a digital output value $D_k$ representing the input voltage $V_i$.

In another embodiment of the invention, a switched mode power supply comprises at least one power switch adapted to convey power between input and output terminals of the power supply, and a digital controller adapted to control operation of the at least one power switch responsive to an output measurement of the power supply. The digital controller includes the self-tracking analog-to-digital converter, a digital filter providing a digital control output based on a difference between a digital output of the self-tracking analog-to-digital converter and a reference value, and a digital pulse width modulator providing a control signal to the at least one power switch. The self-tracking analog to digital converter comprises a digital-to-analog converter (DAC) adapted to provide a variable reference voltage, a windowed flash analog-to-digital converter (ADC) adapted to provide an error signal $e_k$ corresponding to a difference between the output measurement and the variable reference voltage, a first digital circuit adapted to generate a first function value $f(e_k)$ in response to the error signal $e_k$, the first function value $f(e_k)$ representing an amount of correction to be applied to the variable reference voltage, a second digital circuit adapted to provide a counter that combines the first function value $f(e_k)$ with a previous counter state $N_k$ to provide a next counter state $N_{k+1}$, the next counter state $N_{k+1}$ being applied as an input to the DAC, and a third digital circuit adapted to scale the previous counter state $N_k$ by a factor M and combine the scaled counter state $M \cdot N_k$ with the error signal $e_k$ to provide a digital output value $D_k$ representing the output measurement.

A more complete understanding of the self-tracking ADC for use in a switched mode power supply will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention provides a method for digitally controlling a switched mode power supply. More specifically, the invention provides an ADC circuit that produces a digital representation of a parameter that needs to be regulated (e.g., the absolute output voltage of a power supply), so that any additional monitoring and supervisory circuits could be implemented as full digital circuits. In the detailed description that follows, like element numerals are used to describe like elements illustrated in one or more figures.

Figure 1:
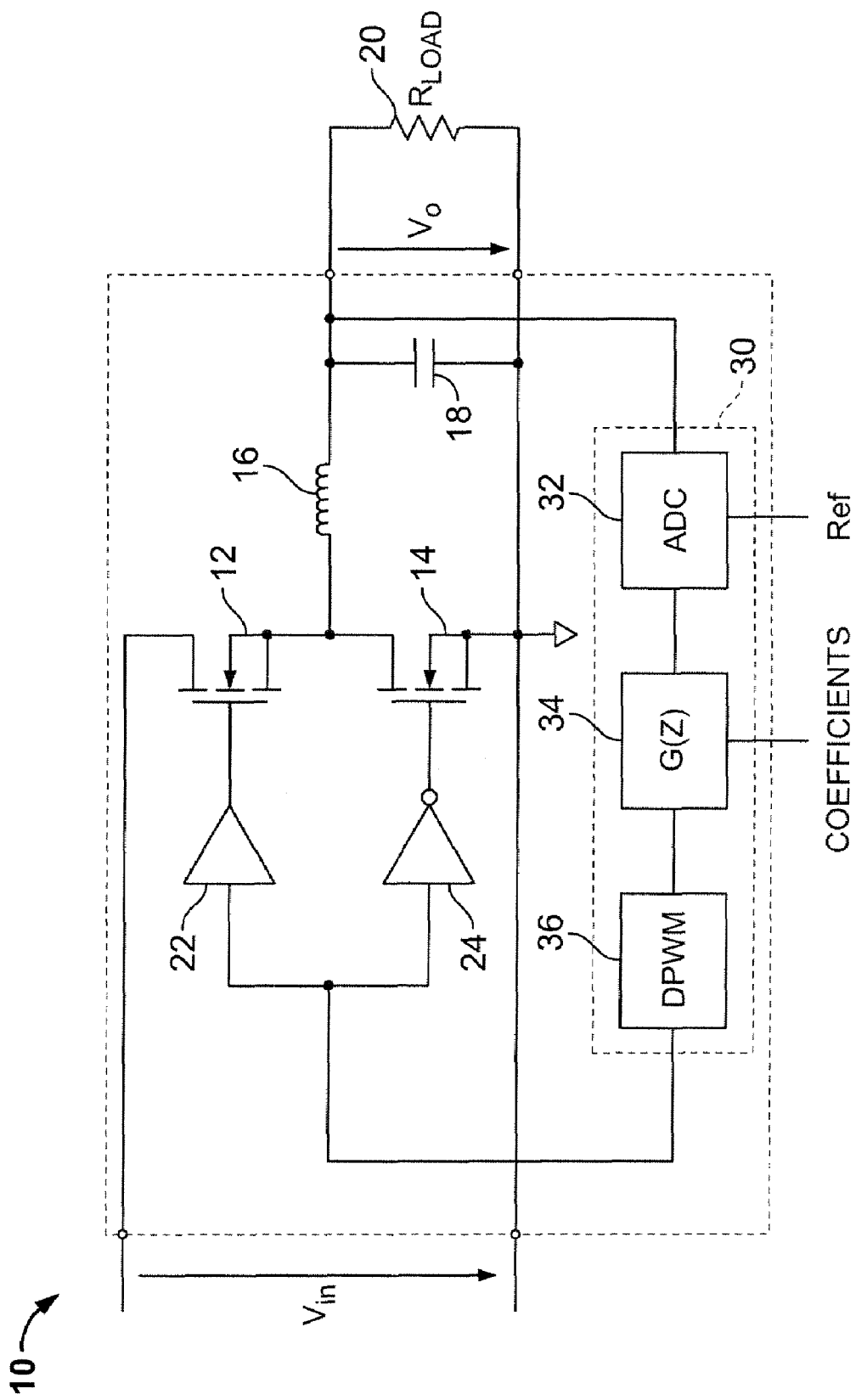
FIG. 1 depicts a switched mode power supply having a digital control circuit.

FIG. 1 depicts an exemplary switched mode power supply 10 having a digital control circuit in accordance with an embodiment of the present invention. The power supply 10 comprises a buck converter topology to convert an input DC voltage $V_{in}$ to an output DC voltage $V_o$ applied to a resistive load 20 ($R_{load}$). The power supply 10 includes a pair of power switches 12, 14 provided by MOSFET devices. The drain terminal of the high side power switch 12 is coupled to the input voltage $V_{in}$, the source terminal of the low side power switch 14 is connected to ground, and the source terminal of the power switches 12 is coupled to the drain terminal of the power switch 14 to define a phase node. An output inductor 16 is coupled in series between the phase node and the terminal providing the output voltage $V_o$, and a capacitor 18 is coupled in parallel with the resistive load $R_{load}$. Respective drivers 22, 24 alternatingly drive the gate terminals of the power switches 12, 14. In turn, the drivers 22, 24 are controlled by digital control circuit 30 (described below). The opening and closing of the power switches 12, 14 provides an intermediate voltage having a generally rectangular waveform at the phase node, and the filter formed by the output inductor 16 and capacitor 18 converts the rectangular waveform into a substantially DC output voltage $V_o$.

The digital control circuit 30 receives a feedback signal from the output portion of the power supply 10. As shown in FIG. 1, the feedback signal corresponds to the output voltage $V_o$, though it should be appreciated that the feedback signal could alternatively (or additionally) correspond to the output current drawn by the resistive load $R_{load}$ or any other signal representing a parameter to be controlled by the digital control circuit 30. The feedback path may further include a voltage divider (not shown) to reduce the detected output voltage $V_o$ to a representative voltage level. The digital control circuit 30 provides a pulse width modulated waveform having a duty cycle controlled to regulate the output voltage $V_o$ (or output current) at a desired level. Even though the exemplary power supply 10 is illustrated as having a buck converter topology, it should be understood that the use of feedback loop control of the power supply 10 using the digital control circuit 30 is equally applicable to other known power supply topologies, such as boost and buck-boost converters in both isolated and non-isolated configurations, and to different control strategies known as voltage mode, current mode, charge mode and/or average current mode controllers.

More particularly, the digital control circuit 30 includes analog-to-digital converter (ADC) 32, digital controller (G(z)) 34, and digital pulse width modulator (DPWM) 36. The ADC 32 further comprises a windowed flash ADC that receives as inputs the feedback signal (i.e., output voltage $V_o$) and a voltage reference (Ref) and produces a digital voltage error signal ($VEd_k$) representing the difference between the inputs (Ref−$V_o$). In the embodiment of FIG. 1, the digital controller 34 has a transfer function G(z) that transforms the voltage error signal $VEd_k$ to a digital output provided to the DPWM 36, which converts the signal into a waveform having a proportional pulse width ($PWM_k$). As discussed above, the pulse-modulated waveform $PWM_k$ produced by the DPWM 36 is coupled to the gate terminals of the power switches 12, 14 through the respective drivers 22, 24.

Figure 2:
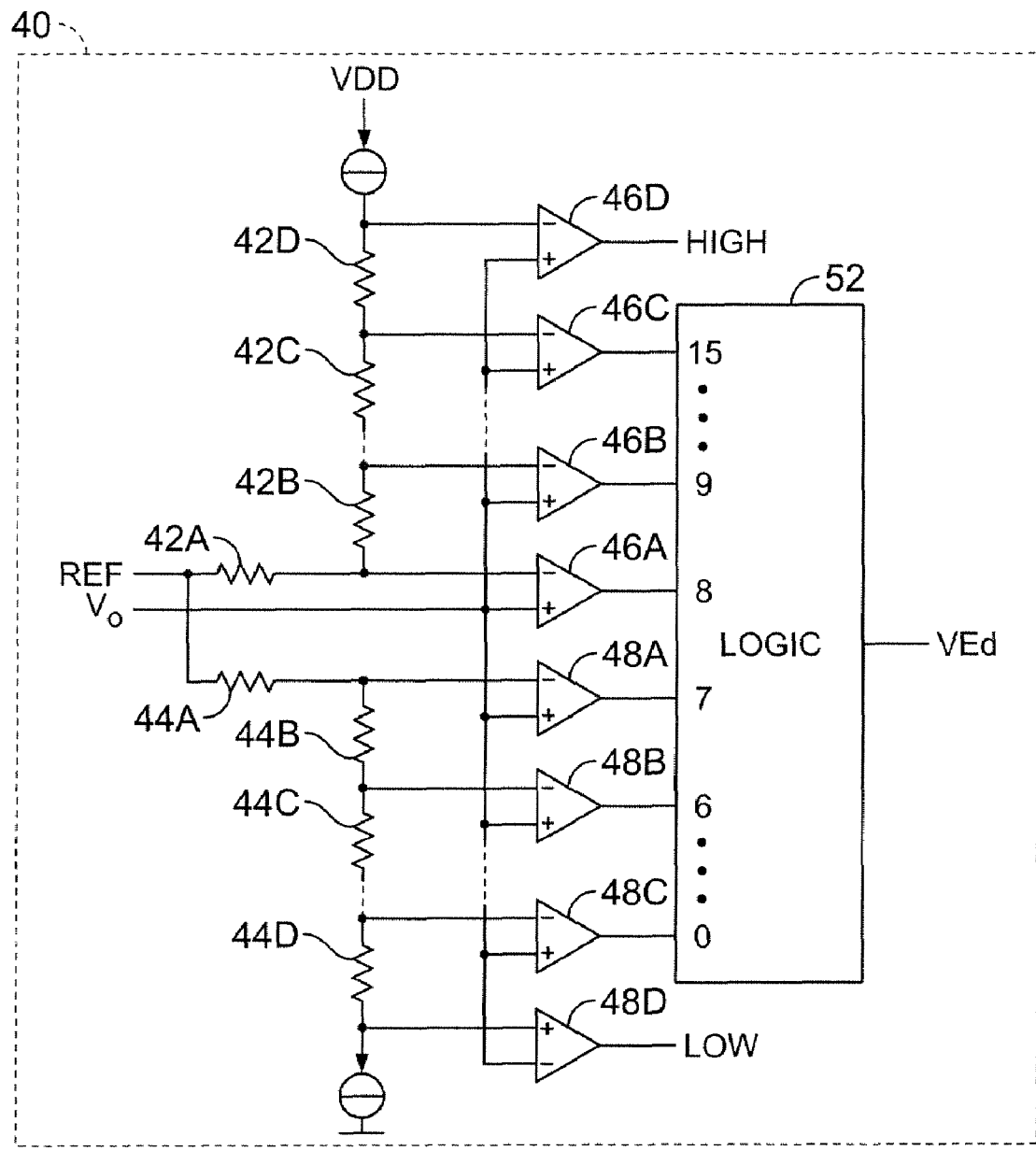
FIG. 2 depicts a windowed flash ADC that provides high and low saturation signals.

FIG. 2 depicts an exemplary windowed flash ADC 40 for use in the digital control circuit 30. The ADC 40 receives as inputs the voltage reference Ref and the output voltage $V_o$. The voltage reference is applied to the center of a resistor ladder that includes resistors 42A, 42B, 42C, 42D connected in series between the reference voltage terminal and a current source connected to a positive supply voltage ($V_{DD}$), and resistors 44A, 44B, 44C, 44D connected in series between the reference voltage terminal and a current source connected to ground. The resistors each have corresponding resistance values to define together with the current sources a plurality of voltage increments ranging above and below the voltage reference Ref. The magnitude of the resistance values and/or current sources can be selected to define the LSB resolution of the ADC 40. An array of comparators is connected to the resistor ladder, including a plurality of positive side comparators 46A, 46B, 46C, 46D and a plurality of negative side comparators 48A, 48B, 48C, 48D. The positive side comparators 46A, 46B, 46C, 46D each have a non-inverting input terminal connected to the output voltage $V_o$, and an inverting input terminal connected to respective ones of the resistors 42A, 42B, 42C, 42D. Likewise, the negative side comparators 48A, 48B, 48C each have a non-inverting input terminal connected to the output voltage $V_o$, and an inverting input terminal connected to respective ones of the resistors 44A, 44B, 44C, 44D. Negative side comparator 48D has a non-inverting input terminal connected to ground and the inverting input terminal connected to the output voltage $V_o$. It should be appreciated that a greater number of resistors and comparators may be included to increase the number of voltage increments and hence the range of the ADC 40, and that a limited number of resistors and comparators is shown in FIG. 2 for exemplary purposes only.

The ADC 40 further includes a logic device 52 coupled to output terminals of comparators 46A, 46B, 46C and 48A, 48B, 48C. The logic device 52 receives the comparator outputs and provides a multi-bit (e.g., 4-bit) parallel output representing the digital voltage error $VEd_k$. By way of example, an output voltage $V_o$ that exceeds the reference voltage Ref by one and a half voltage increments would cause the outputs of comparators 46B, 46A, 48A, 48B, and 48C to go high, while the outputs of comparators 46C, 46D and 48D remain low. The logic device 52 would interpret this as logic level 9 (or binary 1001) and produce an associated voltage error signal $VEd_k$. It should be understood that the voltage reference Ref is variable so as to shift the window of the ADC 40. If the output voltage $V_o$ exceeds the highest voltage increment of the resistor ladder, the output terminal of comparator 46D provides a HIGH saturation signal. Similarly, if the output voltage $V_o$ is lower than the lowest voltage increment of the resistor ladder, the output terminal of comparator 48D provides a LOW saturation signal.

In a conventional windowed flash ADC, the resistors 44A, 44B, 44C, 44D have equal values so as to define a plurality of n voltage references equally spaced above and below the reference voltage Ref. The n comparators 46A, 46B, 46C and 48A, 48B, 48C compare the actual output voltage $V_O$ against the n voltage references and generate a corresponding "thermometer" code, such that comparators 0 to X have an output of one and comparators X+1 to n have an output of zero, with X depending on the voltage amplitude of the $V_O$ signal.

It should be appreciated that the range that the windowed flash ADC 40 is able to convert into a digital signal is limited by the step size between each reference voltage and the number of comparators. In order to keep the circuit complexity to a reasonable level, an exemplary implementation may include sixteen comparators. The step size of the circuit should be kept low enough (e.g., 5 mV) by selecting appropriate values of the resistors to provide enough resolution in the feedback loop. The step size directly relates to the output voltage static regulation and also the noise added to the output voltage due to the quantization of the error signal. With sixteen comparators and a 5 mV step size, the overall window is only ±40 mV. In the event of a sudden and large current change on the output of the power supply 10 (e.g., due to load current changes), the dynamic voltage excursion can easily exceed 40 mV. In that case, the ADC 40 saturates and the voltage error signal $VEd_k$ is no longer linear, i.e., it is not proportional to the actual error. As discussed above, the output terminal of comparator 46D provides a HIGH saturation signal to reflect this saturation condition.

Figure 4:
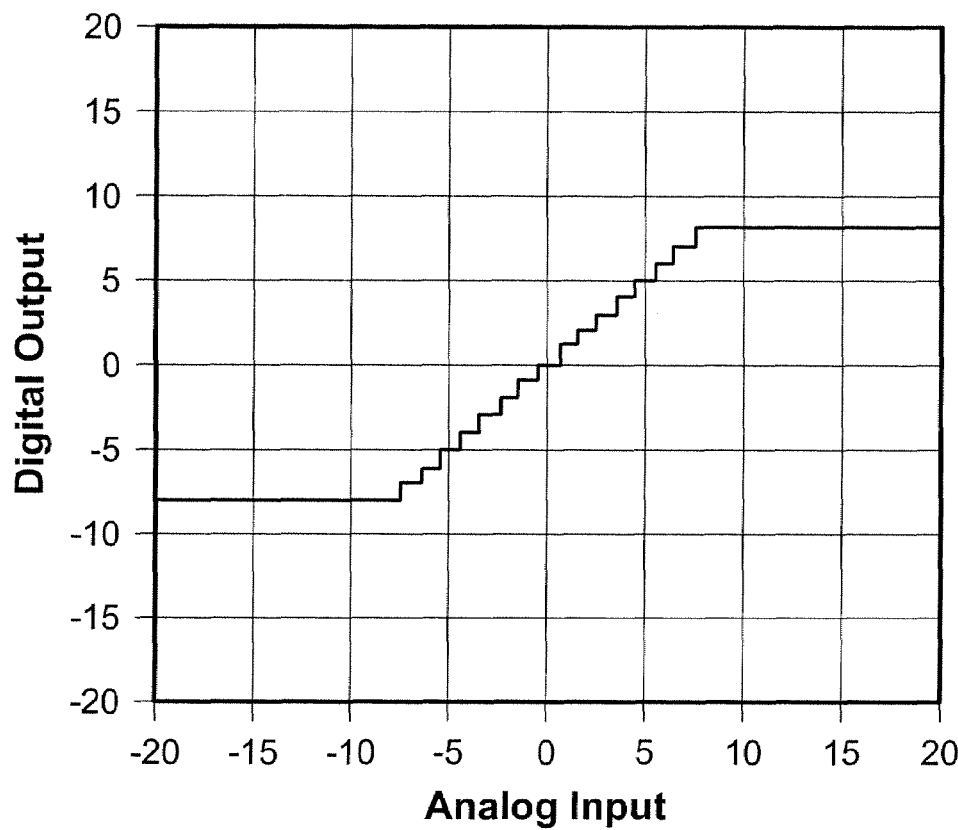
FIG. 4 is a graph depicting a linear ADC transfer function.

FIG. 4 illustrates a graph depicting a linear ADC transfer function in accordance with a conventional windowed flash ADC. The horizontal dimension of the graph reflects the analog error signals input to the logic device 52 and the vertical dimension reflects the digital output from the logic device. As shown, there is a linear relationship between the input analog error signal and the digital output of the ADC within the conversion window due to selection of resistors having uniform values that provide equal voltage increments and the mapping of the digital output values to the input error signal in uniform increments. As a result, the practical window size of the ADC is fairly limited, which has certain disadvantages. Namely, it makes the feedback system non-linear during large and sudden load changes, which tends to make it difficult to guarantee stability in such conditions. In addition, when the correction to the output due to saturation changes so much that it falls immediately into the opposite saturation, the circuit can become unstable and produce a limit cycle oscillation between the ADC window boundaries.

Figure 5:
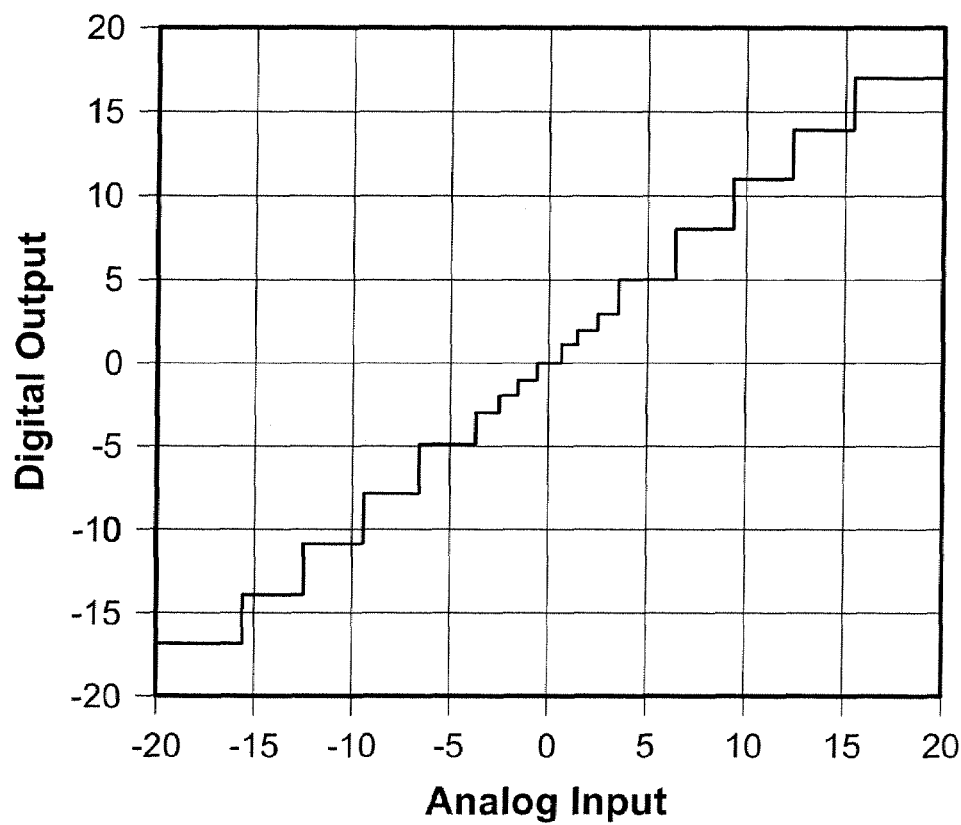
FIG. 5 is a graph depicting a linear ADC transfer function with an increased step size at the window boundaries in accordance with an embodiment of the invention.

FIG. 5 illustrates a graph depicting an ADC transfer function in which the step size is changed in accordance with an embodiment of the invention. As in FIG. 4, the horizontal dimension of the graph reflects the analog error signals input to the logic device 52 and the vertical dimension reflects the digital output of the logic device. The step size is increased in the region adjacent to the boundary of the ADC window by using different resistor values in the boundary regions. In addition, the logic device 52 is changed such that the "temperature" code out of the comparators is mapped into a digital number matching the increased step size at the boundary of the window. This keeps the overall transfer function of the ADC linear. While the window is enlarged overall, the gain is substantially unaffected. The decreased resolution at the ADC boundary regions is acceptable since the steady state voltage of the ADC will always be around zero error (assuming a controller transfer function with a pole at zero). At zero error, the resolution is the same as with the previous embodiment and therefore stability and output voltage precision is unaffected. The larger step size of the ADC only affects the circuit during large dynamic changes, i.e., step increases or decreases in load current). Since this is a dynamic process, the precision of the regulation is not important, but by providing a gain number proportional to the actual error the overall stability of the circuit is improved.

The embodiment of FIG. 5 illustrates the use of two different step sizes, i.e., a first step size in the center of the ADC window and a second, larger step size in the peripheral region of the window. It should be appreciated that there may alternatively be a plurality of intermediary gradations of step size ranging from the first step size in the center of the ADC window to the second step size at the periphery. Each of these gradations of step size would nevertheless be mapped into digital numbers matching the corresponding step size to keep the overall transfer function of the ADC linear.

Figure 6:
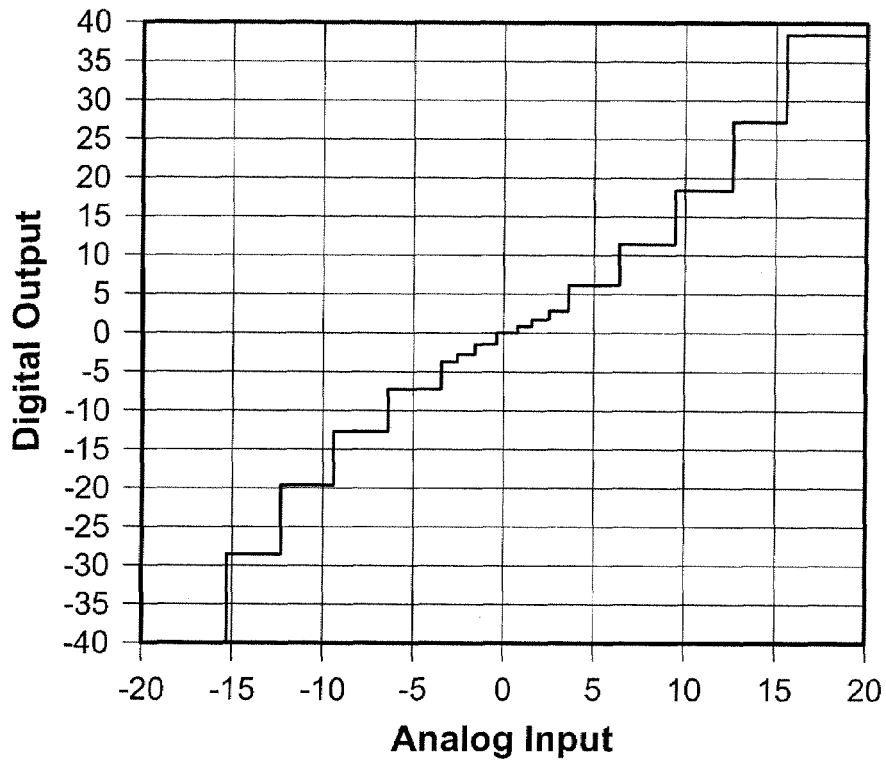
FIG. 6 is a graph depicting a non-linear ADC transfer function with increased step size and increased gain at the window boundaries in accordance with another embodiment of the invention.

While the ADC transfer function of FIG. 5 increases the ADC window size to improve stability robustness and provides a linear relationship between ADC input and output over a larger window size, it does not provide faster settling time during transient regulation conditions. In the embodiment of FIG. 6, the transfer function is further modified to increase the step size at the window boundary as in the preceding embodiment, and also the transfer function is made non-linear toward the window boundary so that the error reported to the controller 36 is larger than the actual value. In the center of the window, the step size and mapping to the digital number is as in the preceding embodiments. But, at the peripheral region of the window, the magnitude of the digital output is increased out of proportion with the step increases of the analog input. The non-linear mapping in the peripheral region of the window helps to speed up the feedback loop for large dynamic errors without altering the small signal stability in steady state conditions. As in the preceding embodiment, the horizontal dimension of the graph reflects the analog error input to the logic circuit 52 and the vertical dimension reflects the digital output of the logic circuit. It should be appreciated that there may be a plurality of gradations of step size and mapping to the digital numbers at the periphery of the ADC window.

Returning now to FIG. 3, a digital controller having a digital filter and ADC 62 is depicted. The digital filter further comprises an infinite impulse response (IIR) filter that produces an output PWM'$_k$ from previous voltage error inputs VEd$_k$ and previous outputs PWM'$_k$. As discussed above, ADC 40 provides the voltage error inputs VEd$_k$. The digital filter outputs PWM'$_k$ are provided to the digital pulse width modulator (DPWM) 36, which provides the pulse width modulated control signal (PWM$_k$) to the power supply power switches.

Figure 3:
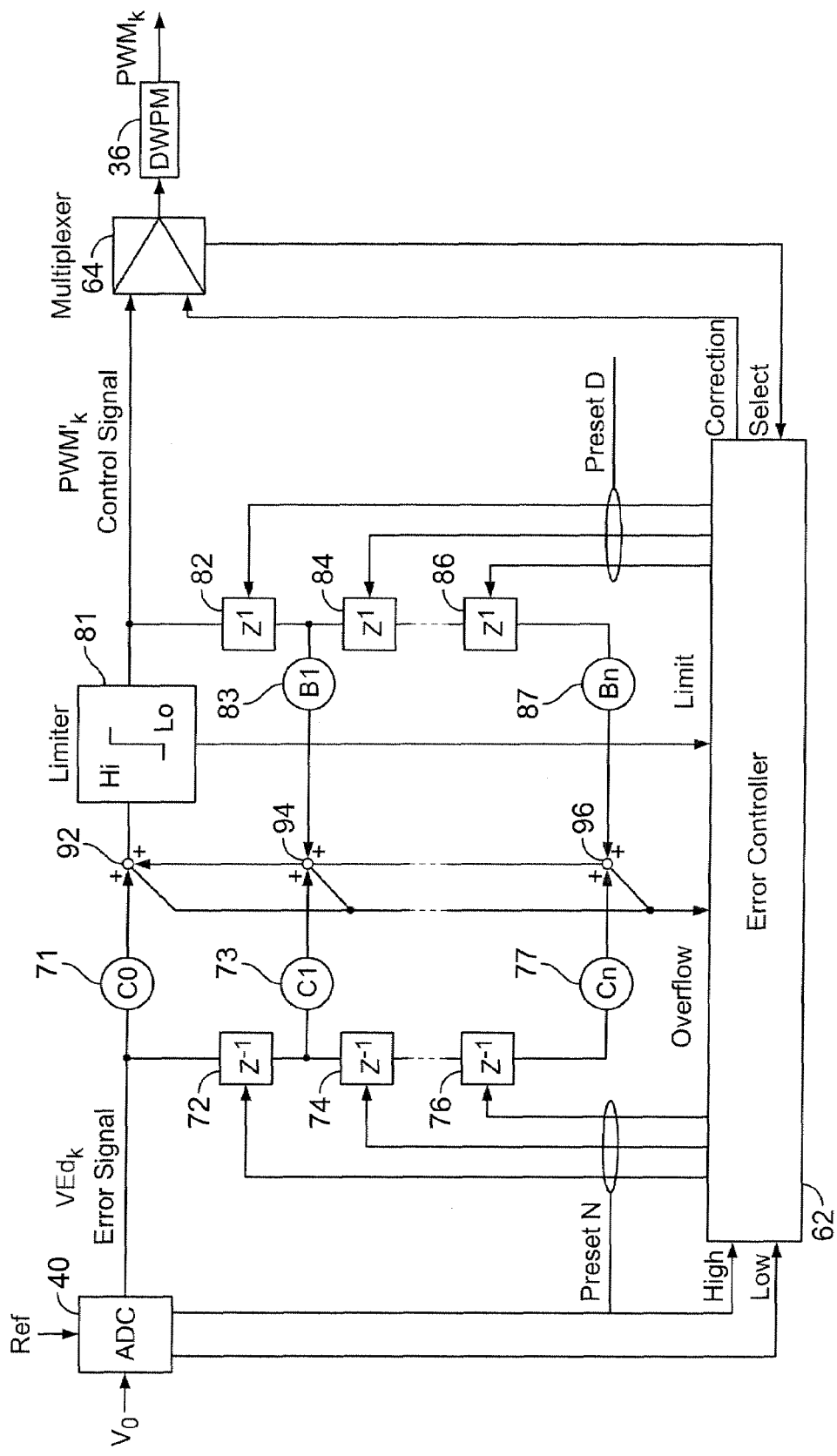
FIG. 3 depicts a digital controller having an infinite impulse response filter and error controller.

The IIR filter is illustrated in block diagram form and includes a first plurality of delay registers 72, 74, ..., 76 (each labeled z$^{-1}$), a first plurality of mathematical operators (multipliers) with coefficients 71, 73, ..., 77 (labeled C0, C1, ..., Cn), a second plurality of mathematical operators (adders) 92, 94, 96, a second plurality of delay registers 82, 84, ..., 86 (each labeled z$^{-1}$), and a third plurality of mathematical operators (multipliers) with coefficients 83, 87 (labeled B1, ..., Bn). Each of the first delay registers 72, 74, 76 holds a previous sample of the voltage error VEd$_k$, which is then weighted by a respective one of the coefficients 71, 73, 77. Likewise, each of the second delay registers 82, 84, 86 holds a previous sample of the output PWM'$_k$, which is then weighted by a respective one of the coefficients 83, 87. The adders 92, 94, and 96 combine the weighted input and output samples. It should be appreciated that a greater number of delay registers and coefficients may be included in the IIR filter, and that a limited number is shown in FIG. 3 for exemplary purposes only. The digital filter structure shown in FIG. 3 is an exemplary implementation of the following transfer function G(z):

$$G(z) = \frac{PWM(z)}{VEd(z)} = \frac{C_0 + C_1 \cdot z^{-1} + C_2 \cdot z^{-2} + \ldots + C_n \cdot z^{-n}}{1 - B_1 \cdot z^{-1} - B_2 \cdot z^{-2} - \ldots - B_n z^{-n}}$$

The error controller 62 receives a plurality of input signals reflecting error conditions of the ADC 40 and the digital filter. Specifically, the error controller 62 receives the HIGH and LOW saturation signals from the ADC 40 reflecting that the output voltage V$_o$ is above and below the voltage window of the ADC, respectively. Each of the mathematical operators (adders) 92, 94, 96 provides an overflow signal to the error controller 62 reflecting an overflow condition (i.e., carry bit) of the mathematical operators. The digital filter further includes a range limiter 81 that clips the output PWM'$_k$ if upper or lower range limits are reached. In that situation, the range limiter 81 provides the error controller 62 with a corresponding limit signal.

The error controller 62 uses these input signals to alter the operation of the digital filter in order to improve the responsiveness of the digital filter to changing load conditions. The error controller 62 is coupled to each of the first plurality of delay registers 72, 74, 76 and second plurality of delay registers 82, 84, 86 to enable the resetting and/or presetting of the value stored therein. As used herein, "resetting" refers to the setting of the value to an initial value (e.g., zero), whereas "presetting" refers to the setting of the value to another predetermined number. Particularly, the error controller 62 can replace the previous samples of the voltage error VEd$_k$ and output PWM'$_k$ with predetermined values that change the behavior of the power supply. The digital controller further includes multiplexer 64 that enables selection between the PWM'$_k$ output signal and a predetermined output signal provided by the error controller 62. A select signal provided by the error controller 62 determines which signal passes through the multiplexer 64. When the ADC 40 goes into HIGH or LOW saturation, the error controller 62 sets the PWM'$_k$ signal to a specific predetermined value (or sequence of values that are dependent in part on the previous samples) by controlling the multiplexer 64. In order to recover smoothly from such a condition, the error controller can also alter the delayed input and output samples by reloading the first plurality of delay registers 72, 74, 76, and second plurality of delay registers 82, 84, 86. This will assure a controlled behavior of the feedback loop as the ADC 40 recovers from saturation.

By way of example, if the ADC 40 experiences a positive saturation, i.e., the LOW signal changing from a low state to a high state, the PWM'$_k$ sample can be reset to zero to help to reduce the error. By resetting the PWM'$_k$ sample to zero, the pulse width delivered to the high side power switch 12 of the power supply 10 goes to zero, effectively shutting off power to the resistive load 20 (see FIG. 1). In order to recover from this situation smoothly, the samples PWM'$_{k-1}$, PWM'$_{k-2}$, . . . , PWM'$_{k-n}$ can also be reset to zero or preset to another value in order to allow a smooth recovery. Likewise, if the ADC 40 experiences a negative saturation, i.e., the HIGH signal changing from a low state to a high state, the PWM'$_k$ sample can be preset to a maximum value to increase the pulse width delivered to the high side power switch 12 to reduce the error. Also, when an internal numeric overflow of the digital filter occurs, the error controller 62 can take actions to prevent uncontrolled command of the power switches of the power supply, such as altering the input and output samples of the digital filters.

In a further embodiment of the invention, the ADC is configured to provide a digital representation of the absolute output voltage ($V_o$). This digital representation of the output voltage $V_o$ can then be further utilized by other power supply supervisory circuits to provide functions such as under-voltage protection, Power-Good-Low monitor, Power-Good-High monitor, and over-voltage protection. Hence, the entire control circuitry for the power supply can be implemented using digital circuitry, thereby eliminating the need for analog circuit components such as comparators.

Figure 7:
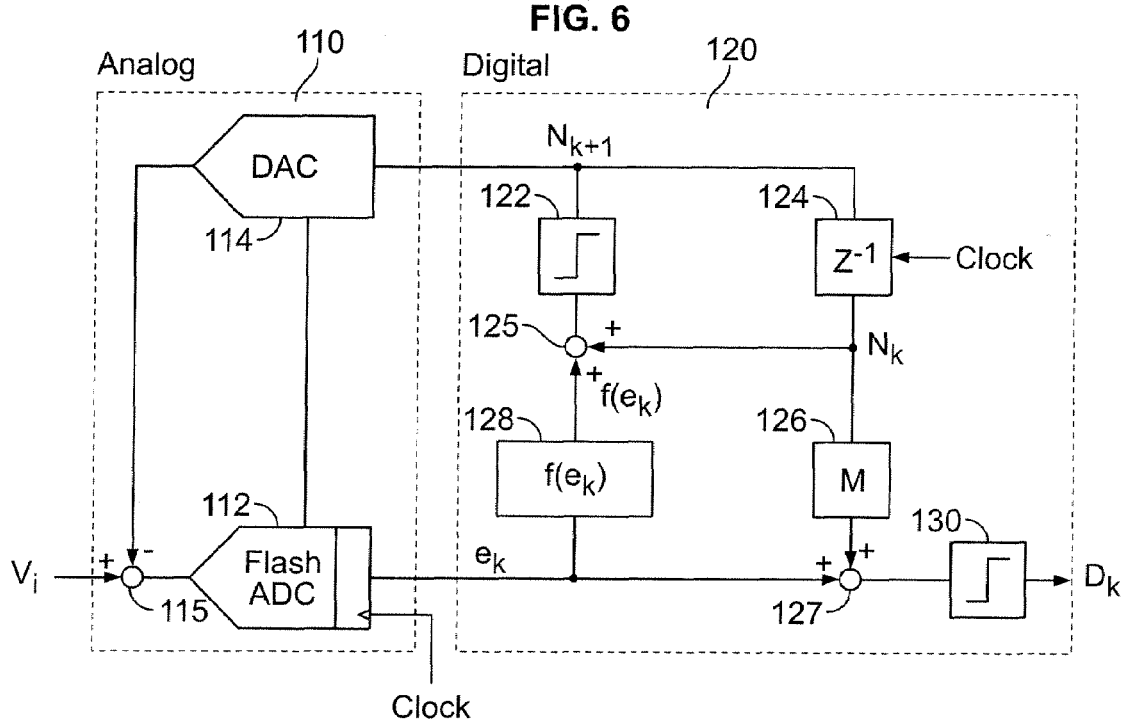
FIG. 7 is a block diagram of a self-tracking ADC in accordance with an embodiment of the invention.

FIG. 7 illustrates an exemplary embodiment of a self-tracking ADC having an analog section 110 and a digital section 120. The analog section 110 includes a windowed flash ADC 112 and a digital-to-analog converter (DAC) 114. A subtractor 115 produces a voltage representing a difference between an input voltage ($V_i$) and a variable reference voltage generated by the DAC 114. The windowed flash ADC 112 digitizes the voltage difference and provides an error signal $e_k$ to the digital section 120, which corrects the DAC variable reference voltage so that it tracks the input voltage $V_i$. It should be appreciated that the input voltage $V_i$ to the self-tracking ADC may actually be the output voltage $V_o$ of the power supply, as described above in the preceding embodiments. Alternatively, the input voltage $V_i$ may be any other voltage for which regulation is desired.

The digital section 120 further includes a clamp 122, an integrator 124, an adder 125, and a function circuit 128 that combine to generate the new digital reference $N_k$ that will be converted back into an analog voltage by DAC 114. The error signal $e_k$ is further used to generate together with the reference value $N_k$ the absolute representation of the input voltage $V_i$. The coarse input voltage $V_i$ representation is provided by $N_k$, and a fine difference value between the coarse DAC reference $N_k$ and the real input voltage is provided by the value $e_k$.

More particularly, the output $e_k$ of the flash windowed ADC 112 is applied to the function circuit 128. The function circuit 128 generates a value $f(e_k)$ that represents the correction to be applied to the variable reference voltage so that it tracks more closely the input voltage. The value $f(e_k)$ may be calculated as follows:

$$f(e_k) = \text{ROUND}(e_k/M)$$

The value $f(e_k)$ is applied to a counter formed by integrator 124, clamp 122, and adder 125. The adder 125 combines the value $f(e_k)$ to the previous counter state $N_k$ and gets clamped by the clamp 122. The clamp 122 provides an output corresponding to the next counter state $N_{k+1}$. The clamp 122 serves to limit the count value and prevent the counter from rolling over. The next state $N_{k+1}$ of the counter is applied to the DAC 114 and gets sampled on the next clock cycle by the integrator 124.

The counter state $N_k$ is used together with the ADC error signal $e_k$ to determine the digital representation of the absolute input voltage $V_i$. The counter state $N_k$ is scaled with the resolution difference M by multiplier 126 and the result is added to the ADC error $e_k$ by adder 127. Finally, another clamp circuit 130 may be coupled to the output of adder 127 to avoid negative digital values or excessive high values. The output value $D_k$ represents the digital representation of the absolute input voltage $V_i$.

It should be appreciated that the resolution of DAC 114 as compared to the mid-band resolution of the windowed flash ADC 112 is lower by a constant factor M. For example, ADC 112 could have a mid-band least significant bit (LSB) resolution of 5 mV. Hence, with a factor M=5 the LSB resolution of DAC 114 would thus be 25 mV. Accordingly, the DAC 114 will therefore generate a relatively coarse reference voltage close to the input voltage, and the ADC 112 will generate an error $e_k$ compared to this coarse reference voltage. The windowed flash ADC 112 has also a much higher resolution in the middle of its window; in contrast, the resolution decreases towards the edge of the window. This has an advantage that the window size for a given number of comparators is larger. A drawback is that the accuracy at the edge of the window decreases, but this is generally not a concern in most power supply applications. Also, it is advantageous to have a larger ADC window, since this will be help to correct the DAC reference voltage with larger step sizes so that the reference voltage can track faster signals.

Continuing the previous example, the DAC 114 could have a total of 8 bits (e.g., defining a range from 0 to 6.375V), the windowed flash ADC 112 could have a total of eighteen comparators with a mid-band resolution of 5 mV, and M could be equal to 5. The resolution of the combined circuit is therefore $\log_2(5 \cdot 2^8) = 10.3$ bit. It is advantageous (but not necessary) that the outer band resolution of the ADC 112 is equal to or a multiple of the DAC resolution, in this example therefore 25 mV, 50 mV, . . . , etc.

Figure 8:
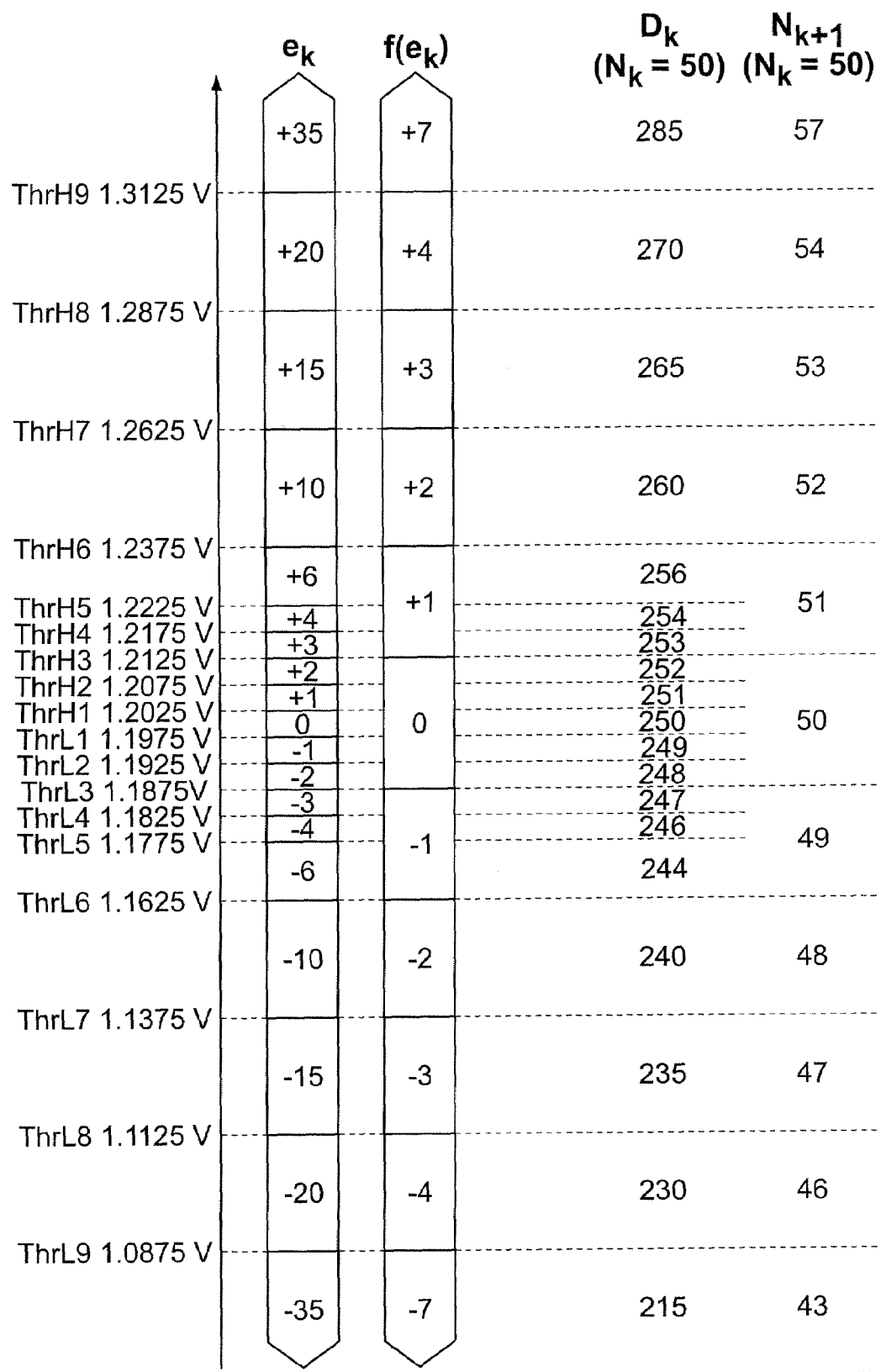
FIG. 8 graphically illustrates a range of exemplary comparator thresholds for the self-tracking ADC of FIG. 7.

FIG. 8 illustrates an example of the comparator thresholds, the corresponding error values $e_k$ from the ADC 112, the function values $f(e_k)$, the next counter state $N_{k+1}$ and the digital output $D_k$ for an assumed input voltage around 1.2V and a DAC reference value $N_k=50$ (with other parameters as noted previously). In this example, the ADC 112 also will be able to track input signals changing with a rate of 7.25 mV per clock cycle.

In the embodiment of FIG. 7, it can be seen that the values $e_k$ to be added to $M \cdot N_k$ to produce the output $D_k$ can be relatively large, but only a few values out of the complete range will actually be used because of the coarse resolution of the window ADC 112 on its boundaries. This may represent a waste of resources for certain applications. Also, the ADC 112 may not produce directly the value $e_k$, but more likely would produce a bit pattern corresponding to the comparator outputs.

Figure 9:
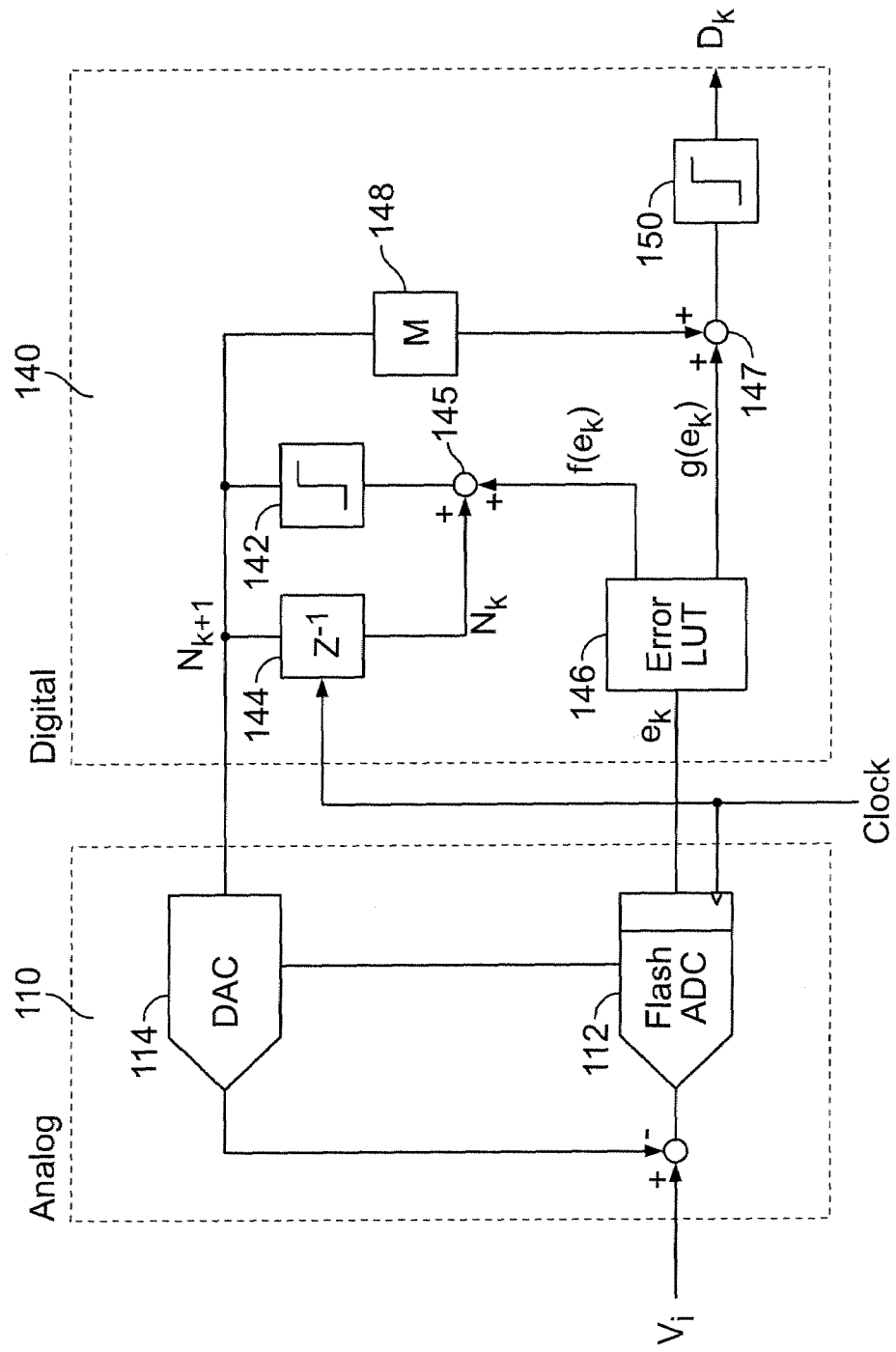
FIG. 9 is a block diagram of a self-tracking ADC in accordance with another embodiment of the invention.

In a second embodiment, the output $D_k$ is generated in a different manner to simplify the implementation. Particularly, FIG. 9 illustrates a modified digital section 140 that includes a clamp 142, an integrator 144, and an adder 145 arranged as in FIG. 7 to provide a counter. Instead of the function circuit, the embodiment of FIG. 9 includes a look up table (LUT) 146 that provides a first function value $f(e_k)$ to the adder 145. As in the preceding embodiment, the resulting digital reference $N_{k+1}$ will be converted back into an analog voltage by DAC 114. The LUT 146 also provides a second function value $g(e_k)$ used to produce the digital representation of the absolute input voltage $V_i$. The new counter state $N_{k+1}$ is scaled with the resolution difference M by multiplier 148 and the result is added to the second function value $g(e_k)$ by adder 147. Another clamp circuit 150 may be coupled to the output of adder 17 to avoid negative digital values or excessive high values. The output value $D_k$ represents the digital representation of the absolute input voltage $V_i$.

More particularly, the output value $D_k$ is determined in accordance with the following expressions:

$$D_k = M \cdot N_k + e_k$$

$$N_{k+1} = N_k + f(e_k)$$

The output value $D_k$ also relates to one of the following expressions:

$$D_k = M \cdot (N_{k+1} - f(e_k)) + e_k$$

$$D_k = M \cdot N_{k+1} + e_k - M \cdot f(e_k)$$

By defining $g(e_k) = e_k - M \cdot f(e_k)$ and using the definition of $f(e_k)$ stated above yields:

$$g(e_k) = e_k - M \cdot \text{ROUND}(e_k/M)$$

It will be appreciated that the function $g(e_k)$ can only take the values given by the following inequality:

$$-M/2 < g(e_k) < M/2$$

Figure 10:
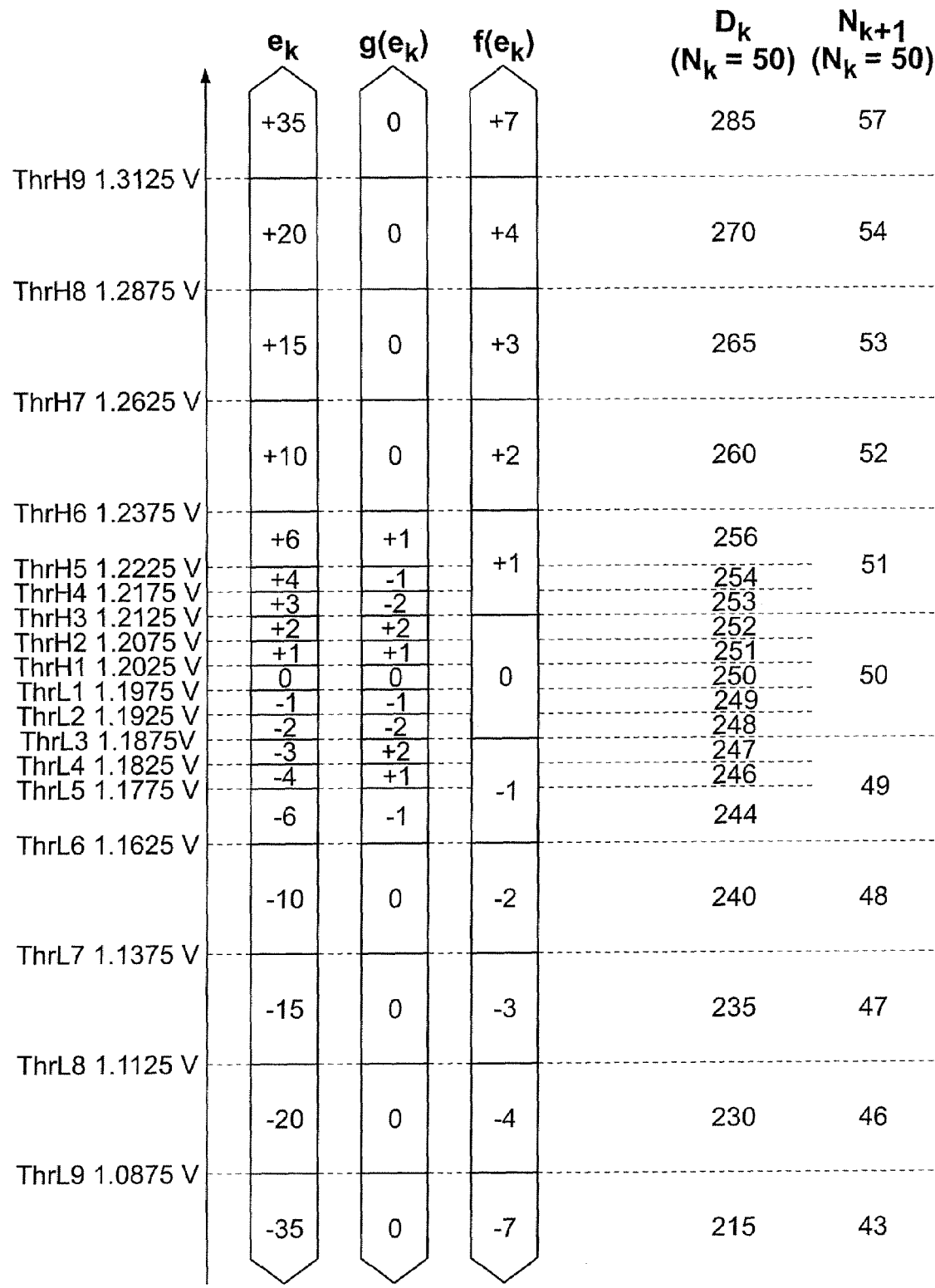
FIG. 10 graphically illustrates a range of exemplary comparator thresholds for the self-tracking ADC of FIG. 9.

In the example above, $g(e_k)$ would therefore only be either $-2$, $-1$, $0$, $1$ or $2$, which is much simpler to handle. Hence, a look up table may be used instead of arithmetic circuitry to generate the function $g(e_k)$. FIG. 10 shows the corresponding values for the different functions for an input voltage $V_i$ around 1.2V and $N_k = 50$ as an example.

In steady state conditions (i.e., input voltage $V_i$ is essentially a constant DC voltage), it would be advantageous to have the DAC reference value also being constant. By way of example, a steady state input voltage $V_i$ may be converted to $e_k = +3$ with $N_k$. In the next cycle, the DAC 114 will be incremented by one and the result should theoretically be $e_k = -2$ with $N_{k+1} = N_k$, and remain there since the error is small enough to not provoke a reference voltage change (i.e., $f(e_k) = 0$). But, because of small errors in the comparator thresholds of the flash windowed ADC 112 and the LSB size of the DAC 114, the conversion result could be $e_k = -3$ with $N_{k+1} = N_k - 1$. This result could again lower the output of the DAC 114 by 1 LSB. Due to the same uncertainty in the next cycle, the DAC 114 could again be incremented by 1. These successive limit cycle oscillations are particularly undesirable in regulation applications.

Figure 11:
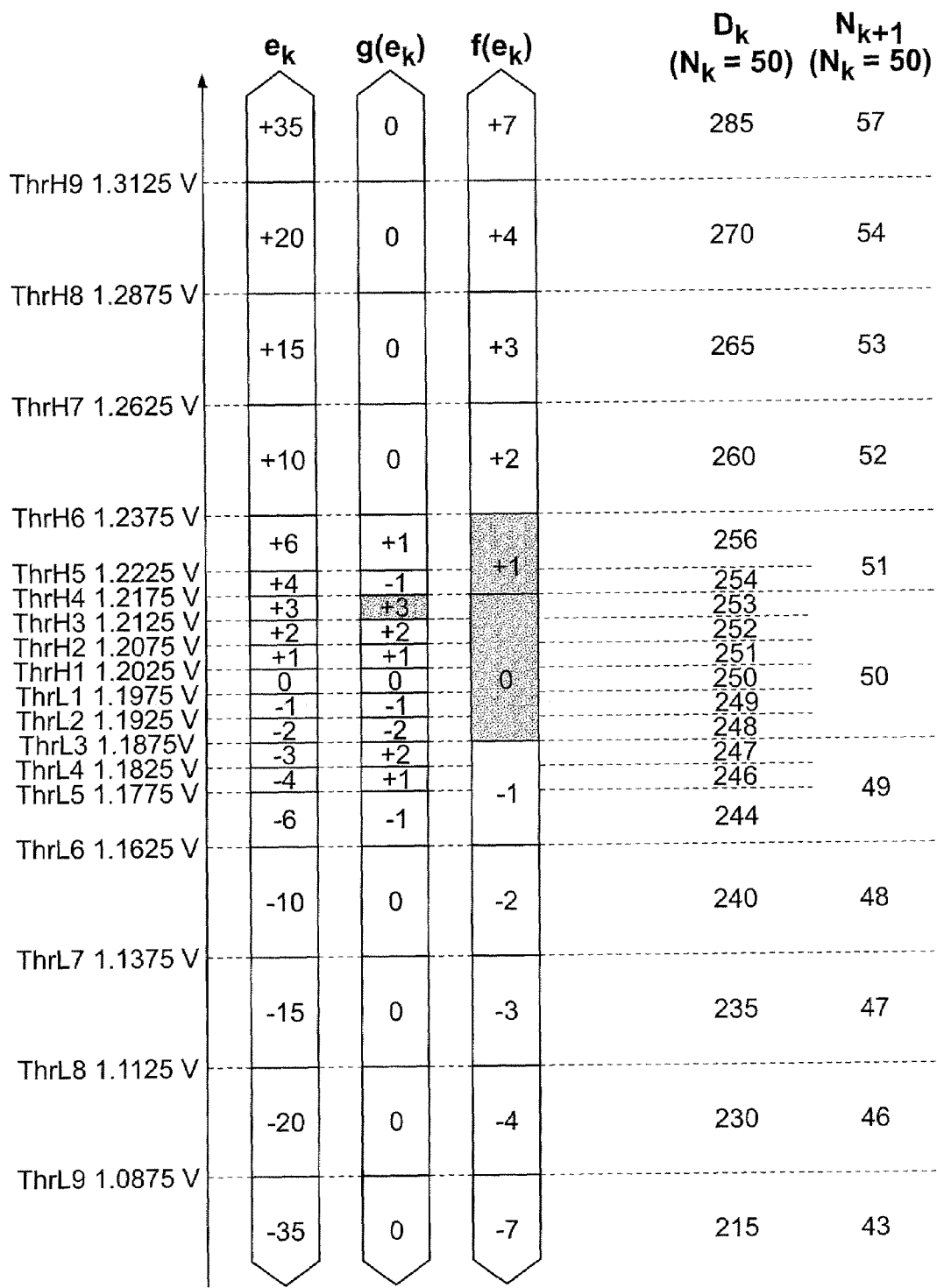
FIG. 11 graphically illustrates a range of exemplary comparator thresholds for an alternative embodiment of the self-tracking ADC that avoids limit cycle oscillations.

To avoid such limit cycle oscillations, the switchpoints causing the DAC 114 to increment and decrement in midband should not be symmetric. This will introduce a small hysteresis and will eliminate the limit cycle oscillation. No change in thresholds are necessary to accomplish this. For example, a different encoding of the $g(e_k)$ and $f(e_k)$ values as shown in FIG. 11 will have the same effect. Note that changes to the preceding FIG. 10 are marked in grey in FIG. 11. The hysteresis is graphically shown in FIG. 11 as an asymmetry between the $+1$ and $-1$ values of $f(e_k)$.

Figure 12:
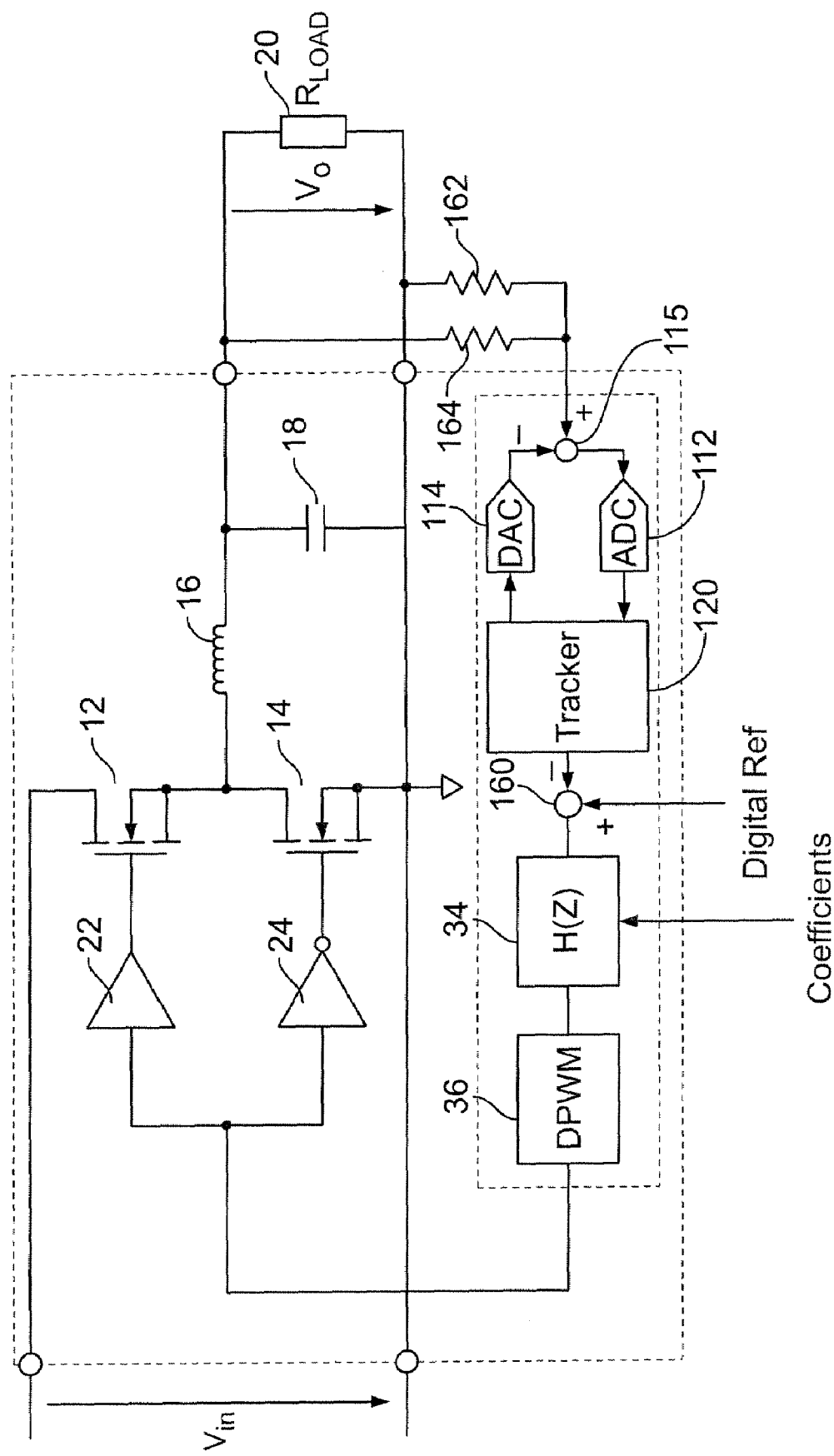
FIG. 12 depicts a switched mode power supply having a digital control circuit that includes a self-tracking ADC.

Lastly, FIG. 12 illustrates an exemplary switched mode power supply (as in FIG. 1) including a digital control circuit having the self-tracking ADC as discussed above with respect to FIGS. 7-11. As in FIG. 1, the digital control circuit includes a digital controller 34 and a digital pulse width modulator (DPWM) 36. In this embodiment, the digital control circuit further includes a self-tracking ADC comprising DAC 114, adder 115 and flash windowed ADC 112 substantially as described above in FIGS. 7 and 9. The adder 115 is further coupled to the junction of a voltage divider formed by resistors 164, 162 connected in series across the output terminals of the switched mode power supply. It should be appreciated that the voltage at the junction of the voltage divider is a scaled representation of the output voltage $V_o$ of the switched mode power supply, and corresponds to the input voltage $V_i$ described above with respect to FIGS. 7-11.

The DAC 114 and ADC 112 are further coupled to a tracker circuit 120 corresponding to the digital section 120 of FIG. 7. Alternatively, it should be appreciated that the tracker circuit 120 could be provided by the digital section 140 of FIG. 9. The tracker circuit 120 provides an output value corresponding to a digital representation of the scaled representation of the absolute output voltage $V_o$ of the switched mode power supply. This digital representation of the output voltage $V_o$ is subtracted from a reference voltage by subtractor 160, which provides a difference value (or voltage error) to the digital controller 34. It should be appreciated that the digital representation of the output voltage $V_o$ may also be used by other control circuitry used to monitor and regulate the performance of the switched mode power supply.

Having thus described a preferred embodiment of a self-tracking ADC for use in a switched mode power supply, it should be apparent to those skilled in the art that certain advantages of the system have been achieved. It should also be appreciated that various modifications, adaptations, and alternative embodiments thereof may be made within the scope and spirit of the present invention. The invention is further defined by the following claims.

What is claimed is:

1. A switched mode power supply comprising:
   at least one power switch adapted to convey power between input and output terminals of said power supply; and
   a digital controller adapted to control operation of said at least one power switch responsive to an output measurement of said power supply, said digital controller comprising:
      a digital-to-analog converter (DAC) adapted to provide a variable reference voltage;
      a windowed flash analog-to-digital converter (ADC) adapted to provide an error signal $e_k$ corresponding to a difference between the output measurement and the variable reference voltage;
      a first digital circuit adapted to generate a first function value $f(e_k)$ in response to the error signal $e_k$, the first function value $f(e_k)$ representing an amount of correction to be applied to the variable reference voltage;
      a second digital circuit adapted to provide a counter that combines the first function value $f(e_k)$ with a previous counter state $N_k$ to provide a next counter state $N_{k+1}$, the next counter state $N_{k+1}$ being applied as an input to the DAC; and
      a third digital circuit adapted to scale the previous counter state $N_k$ by a factor M and combine the scaled counter state $M \cdot N_k$ with the error signal $e_k$ to provide a digital output value $D_k$ representing the output measurement;
      a digital filter providing a digital control output based on a difference between the digital output value $D_k$ and a reference value; and
      a digital pulse width modulator providing a control signal to said at least one power switch, said control signal having a pulse width corresponding to said digital control output.

2. The switched mode power supply of claim 1, wherein the DAC has a resolution that is lower than a corresponding mid-band resolution of the ADC by the factor M.

3. The switched mode power supply of claim 1, wherein the first digital circuit further comprises a look-up table.

4. The switched mode power supply of claim 1, wherein the first digital circuit is further adapted to provide a second function value $g(e_k)$ corresponding to a difference between the error signal $e_k$ and the first function value $f(e_k)$ scaled by M.

5. The self-tracking analog-to-digital converter of claim 4, wherein the first digital circuit provides the second function value $g(e_k)$ in accordance with the following expression:

$$g(e_k) = e_k - M \cdot \text{ROUND}(e_k/M).$$

6. The switched mode power supply of claim 1, wherein the ADC has a transfer function providing a substantially linear region at a center of a corresponding error window.

7. The switched mode power supply of claim 6, wherein said transfer function further comprises a first step size in said center of said error window and at least one additional step size in a peripheral region of said error window, each said at least one additional step size being larger than said first step size.

8. The switched mode power supply of claim 7, wherein said first step size and said at least one additional step size each reflect a linear relationship between said voltage difference and said corresponding digital values.

9. The switched mode power supply of claim 7, wherein said first step size reflects a linear relationship between said voltage difference and said corresponding digital values, and said at least one additional step size reflects a non-linear relationship between said voltage difference and said corresponding digital values.

10. The switched mode power supply of claim 1, wherein said digital filter further comprises an infinite impulse response filter.

11. The switched mode power supply of claim 10, wherein said infinite impulse response filter provides the following transfer function G(z):

$$G(z) = \frac{PWM(z)}{VEd(z)} = \frac{C_0 + C_1 \cdot z^{-1} + C_2 \cdot z^{-2} + \ldots + C_n \cdot z^{-n}}{1 - B_1 \cdot z^{-1} - B_2 \cdot z^{-2} - \ldots - B_n \cdot z^{-n}}$$

wherein PWM(z) is the digital control output, VEd(z) is an error signal, $C_0 \ldots C_n$ are input side coefficients, and $B_1 \ldots B_n$ are output side coefficients.

12. The switched mode power supply of claim 1, further comprising a voltage divider operatively coupled to the output terminals of the power supply to provide the output measurement.

* * * * *